(12) United States Patent
Haase et al.

(10) Patent No.: US 9,053,959 B2
(45) Date of Patent: *Jun. 9, 2015

(54) SEMICONDUCTOR LIGHT CONVERTING CONSTRUCTION

(75) Inventors: Michael A. Haase, St. Paul, MN (US); Jun-Ying Zhang, Woodbury, MN (US); Thomas J. Miller, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 790 days.

This patent is subject to a terminal disclaimer.

(21) Appl. No.: 13/000,598

(22) PCT Filed: Jun. 1, 2009

(86) PCT No.: PCT/US2009/045801
§ 371 (c)(1),
(2), (4) Date: Dec. 21, 2010

(87) PCT Pub. No.: WO2009/158138
PCT Pub. Date: Dec. 30, 2009

(65) Prior Publication Data
US 2011/0101403 A1    May 5, 2011

Related U.S. Application Data

(60) Provisional application No. 61/075,918, filed on Jun. 26, 2008.

(51) Int. Cl.
*H01L 29/06* (2006.01)
*H01L 31/00* (2006.01)
(Continued)

(52) U.S. Cl.
CPC ...... *H01L 25/0756* (2013.01); *H01L 27/14609* (2013.01); *H01L 31/1013* (2013.01);
(Continued)

(58) Field of Classification Search
CPC .......... H01L 27/14603; H01L 27/14609; H01L 31/1013
USPC .................................. 257/13, 14, 98
See application file for complete search history.

(56) References Cited

U.S. PATENT DOCUMENTS 6,987,288 B2   1/2006   Rattier
7,161,188 B2   1/2007   Orita
(Continued)

FOREIGN PATENT DOCUMENTS

CN    1577902    2/2005
CN    1886014    12/2006
(Continued)

OTHER PUBLICATIONS

Boroditsky et al., "Spontaneous Emission Extraction and Purcell Enhancement from Thin-Film 2-D Photonic Crystals," pp. 2096-2112, Journal of Lightwave Technology, vol. 17, No. 11, 1999.
(Continued)

*Primary Examiner* — Zandra Smith
*Assistant Examiner* — John M Parker
(74) *Attorney, Agent, or Firm* — Yufeng Dong; Kristofor L. Storvick; Jay R. Pralle

(57) ABSTRACT

Semiconductor light converting constructions are disclosed. The semiconductor light converting construction includes a first semiconductor layer for absorbing at least a portion of light at a first wavelength; a semiconductor potential well for converting at least a portion of the light absorbed at the first wavelength to light at a longer second wavelength; and a second semiconductor layer that is capable of absorbing at least a portion of light at the first wavelength. The first semiconductor layer has a maximum first index of refraction at the second wavelength. The second semiconductor layer has a second index of refraction at the second wavelength that is greater than the maximum first index of refraction.

15 Claims, 13 Drawing Sheets

(51) Int. Cl.

| | | |
|---|---|---|
| *H01L 25/075* | (2006.01) | |
| *H01L 27/146* | (2006.01) | |
| *H01L 31/101* | (2006.01) | |
| *H01L 33/44* | (2010.01) | |
| *H01L 33/50* | (2010.01) | |
| *H01L 51/50* | (2006.01) | |
| *H01L 51/52* | (2006.01) | |

(52) U.S. Cl.
CPC ........... *H01L27/14603* (2013.01); *H01L 33/44* (2013.01); *H01L 33/50* (2013.01); *H01L 51/5036* (2013.01); *H01L 51/5262* (2013.01); *H01L 2924/09701* (2013.01); *H01L 2933/0091* (2013.01)

(56) References Cited

U.S. PATENT DOCUMENTS

| | | |
|---|---|---|
| 7,196,354 B1 | 3/2007 | Erchak |
| 7,268,490 B2 | 9/2007 | Oota |
| 7,361,938 B2 | 4/2008 | Mueller |
| 7,833,425 B2 | 11/2010 | Wang |
| 8,138,666 B2 | 3/2012 | Harada |
| 2003/0016720 A1 | 1/2003 | Funabashi |
| 2003/0080431 A1 | 5/2003 | Uzoh |
| 2003/0174745 A1 | 9/2003 | Asano |
| 2004/0159843 A1 | 8/2004 | Edmond |
| 2005/0084611 A1 | 4/2005 | Okuyama |
| 2005/0139842 A1 | 6/2005 | Murofushi |
| 2005/0141240 A1 | 6/2005 | Hata |
| 2005/0224826 A1 | 10/2005 | Keuper |
| 2006/0071232 A1 | 4/2006 | Sasakura |
| 2006/0124917 A1 | 6/2006 | Miller |
| 2006/0124918 A1* | 6/2006 | Miller et al. ............. 257/14 |
| 2006/0186802 A1 | 8/2006 | Cok |
| 2007/0021876 A1 | 1/2007 | Isaji |
| 2007/0190676 A1 | 8/2007 | Chu |
| 2007/0228935 A1 | 10/2007 | Kim |
| 2007/0257590 A1 | 11/2007 | Bechtel |
| 2007/0284565 A1 | 12/2007 | Leatherdale |
| 2008/0047929 A1 | 2/2008 | Wang |
| 2008/0149952 A1 | 6/2008 | Kasahara |
| 2009/0114944 A1 | 5/2009 | Ono |
| 2009/0212685 A1 | 8/2009 | Boerner |
| 2011/0101382 A1 | 5/2011 | Smith |
| 2011/0101402 A1 | 5/2011 | Zhang |
| 2011/0117686 A1 | 5/2011 | Zhang |

FOREIGN PATENT DOCUMENTS

| | | |
|---|---|---|
| JP | 2006-261659 | 9/2006 |
| JP | 2007-273746 | 10/2007 |
| KR | 10-2007-0011041 | 1/2007 |
| KR | 10-2008-0000884 | 1/2008 |
| TW | 200608598 | 3/2006 |
| WO | WO 2009/075972 A2 | 6/2009 |
| WO | WO 2009/158158 | 12/2009 |
| WO | WO 2009/158159 | 12/2009 |
| WO | WO 2009/158191 | 12/2009 |

OTHER PUBLICATIONS

Deckman, H. W., and Dunsmiur, J. H., "Natural lithography", Applied Physics Letters, pp. 377-379, vol. 41, No. 4, Aug. 15, 1982, © American Institute of Physics.

Ee et al., "Enhancement of light extraction efficiency of InGaN quantum wells light emitting diodes using SiO2/polystyrene microlens arrays", Applied Physics Letters, vol. 91, pp. 221107-1-221107-2, © 2007 American Institute of Physics.

Fujii et al., "Increase in the extraction of efficiency of GaN-based light-emitting diodes via surface roughening", Applied Physics Letters, vol. 84, No. 6, pp. 855-857, Feb. 9, 2004.

Haginoya et al., "Nanostructure array fabrication with a size-controllable natural lithography", Applied Physics Letters, pp. 2934-2936, vol. 71, No. 20, Nov. 17, 1997.

Huang et al., "Enhanced light output of an InGaN/GaN light emitting diode with a nano-roughened p-GaN surface", Institute of Physics Publishing, Nanotechnology, vol. 16, pp. 1844-1848, © 2005 IOP Publishing Ltd., Printed in the United Kingdom.

Huang et al., "Nitride-based LEDs with nano-scale textured sidewalls using natural lithography", Institute of Physics Publishing, Nanotechnology, vol. 17, pp. 2298-3001, © 2006 IOP Publishing Ltd., Printed in the United Kingdom.

Iwaya et al., "Improvement in light extraction efficiency in group III nitride-based light-emitting diodes using moth-eye structure", Science Direct, Thin Solid Films 515, pp. 768-770, 2006.

Kasugai et al., "High-Efficiency Nitride-Based Light-Emitting Diodes with Moth-Eye Structure", Japanese Journal of Applied Physics, vol. 44, No. 10, 2005, pp. 7414-7417, © 2005 The Japan Society of Applied Physics.

Kim et al., "Enhancement in the external quantum efficiency of a blue light-emitting diode by a photonic crystal surface grating," Electronics Letters, vol. 41, No. 20, pp. 1138-1139, Sep. 29, 2005.

Lee et al., "High light extraction efficiency of gallium nitride light emitting diode with silicon oxide hemispherical microlens", Applied Physics Letters, vol. 92, pp. 061103-1-061103-3, © 2008 American Institute of Physics.

Lin et al., "Enhanced Light Output in Nitride-Based Light-Emitting Diodes by Roughening the Mesa Sidewall", IEEE Photonics Technology Letters, vol. 17, No. 10, pp. 2038-2040, Oct. 2005.

Windisch et al., "40% Efficient Thin-Film Surface-Textured Light-Emitting Diodes by Optimization of Natural Lithography", IEEE Transactions on Electron Devices, pp. 1492-1498, vol. 47, No. 7, Jul. 2000.

Zelsman et al., "Seventy-fold enhancement of light extraction from a defectless photonic crystal made on silicon-on-insulator", Applied Physics Letters, vol. 83, No. 13, Sep. 29, 2003.

U.S. Appl. No. 60/893,804, entitled "Array of Luminescent Elements", filed Mar. 8, 2007.

U.S. Appl. No. 60/866,265, entitled "Planarized LED with Optical Extractor", filed Nov. 17, 2006.

U.S. Appl. No. 60/804,544, entitled "LED Device with Re-emitting Semiconductor Construction and Converging Optical Element", filed Jun. 12, 2006.

U.S. Appl. No. 61/012,608, entitled "Semiconductor Light Emitting Device and Method of Making Same", filed Dec. 10, 2007.

U.S. Appl. No. 61/012,604, entitled "Down-converted Light Emitting Diode with Simplified Light Extraction", filed Dec. 10, 2007.

Written Opinion of International Application No. PCT/US2009/046835, 4 pgs.

Search Report of International Application No. PCT/US2009/046835, 3 pgs.

Written Opinion of International Application No. PCT/US2009/045801, 5 pgs.

Search Report of International Application No. PCT/US2009/045801, 3 pgs.

Written Opinion of International Application No. PCT/US2009/046077, 4 pgs.

Search Report of International Application No. PCT/US2009/046077, 3 pgs.

Written Opinion of International Application No. PCT/US2009/046083, 3 pgs.

Search Report of International Application No. PCT/US2009/046083, 3 pgs.

Guo S P et al: "Distributed Bragg reflectors for visible range applications based on (Zn,Cd,Mg)Se lattice matched in InP" Applied Physics Letters, American Institute of Physics, US, vol. 77, No. 25, Dec. 18, 2000, pp. 4107-4109, XP012026930, ISSN: 0003-6951, DOI: 10.1063/1.1334650.

* cited by examiner

SEMICONDUCTOR LIGHT CONVERTING CONSTRUCTION

CROSS REFERENCE TO RELATED APPLICATIONS

This application is a national stage filing under 35 U.S.C. 371 of PCT/US2009/045801, filed on Jun. 1, 2009, which claims priority to U.S. Provisional Application No. 61/075,918, filed on Jun. 26, 2008, the disclosure of which is incorporated by reference in its/their entirety herein.

FIELD OF THE INVENTION

This invention generally relates to semiconductor light emitting devices. The invention is particularly applicable to semiconductor light emitting devices having improved brightness.

BACKGROUND

Light emitting devices are used in many different applications, including projection display systems, backlights for liquid crystal displays and the like. Projection systems typically use one or more white light sources, such as high pressure mercury lamps. The white light beam is usually split into three primary colors, red, green and blue, and is directed to respective image forming spatial light modulators to produce an image for each primary color. The resulting primary-color image beams are combined and projected onto a projection screen for viewing.

More recently, light emitting diodes (LEDs) have been considered as an alternative to white light sources. LEDs have the potential to provide the brightness and operational lifetime that would compete with conventional light sources. Current LEDs, however, are relatively inefficient because of light entrapment in, for example, the high index regions.

SUMMARY OF THE INVENTION

Generally, the present invention relates to semiconductor light emitting devices. In one embodiment, a semiconductor light converting construction includes a semiconductor potential well for converting at least a portion of light at a first wavelength to light at a longer second wavelength; an outer layer that is disposed on the semiconductor potential well and has a first index of refraction; and a structured layer disposed on the outer layer that has a second index of refraction smaller than the first index of refraction. The structured layer includes a plurality of structures that are disposed directly on the outer layer and a plurality of openings that expose the outer layer. The semiconductor light converting construction further includes and a structured overcoat disposed directly on at least a portion of the structured layer and a portion of the outer layer in the plurality of openings. The overcoat has a third index of refraction that is greater than the second index of refraction. In some cases, the average thickness of the structured overcoat is no more than about 1000 nm, or no more than about 700 nm. In some cases, an outer surface of the overcoat conforms to an outer surface of the structured layer.

In another embodiment, a light emitting system includes an LED and a light converting construction that down-converts light emitted by the LED and has a structured outermost surface. The structured surface has a plurality of openings that expose an inner layer of the light converting construction. The light emitting system further includes a structured overcoat that is formed on the structured outermost surface and the exposed areas of the inner layer. The structured overcoat enhances light extraction from the light converting construction. An outer surface of the overcoat conforms to the structured outermost surface. In some cases, the index of refraction of the overcoat is in a range from about 1.8 to about 2.7.

In another embodiment, a semiconductor light converting construction includes a first semiconductor layer for absorbing at least a portion of light at a first wavelength; a semiconductor potential well for converting at least a portion of the light absorbed at the first wavelength to light at a longer second wavelength; and a second semiconductor layer capable of absorbing at least a portion of light at the first wavelength. The first semiconductor layer has a maximum first index of refraction at the second wavelength. The second semiconductor layer has a second index of refraction at the second wavelength that is greater than the maximum first index of refraction. In some cases, the band gap energy of the first semiconductor layer is greater than the energy of a photon at the second wavelength. In some cases, the band gap energy of the second semiconductor layer is greater than the energy of a photon at the second wavelength. In some cases, the band gap energy of the second semiconductor layer is smaller than a minimum band gap energy of the first semiconductor layer. In some cases, the band gap energy of the first semiconductor layer is greater than the transition energy of the semiconductor potential well. In some cases, the band gap energy of the second semiconductor layer is greater than the transition energy of the semiconductor potential well. In some cases, when illuminated with an incident light having a spectrum centered at the first wavelength and includes a wavelength $\lambda_e$ longer than the first wavelength, the first semiconductor layer absorbs light at the first wavelength, but not light at $\lambda_e$, and the second semiconductor layer absorbs light at $\lambda_e$.

In another embodiment, a semiconductor light converting construction includes a first semiconductor layer for absorbing at least a portion of light at a first wavelength; a semiconductor potential well for converting at least a portion of the light absorbed at the first wavelength to light at a longer second wavelength; and a second semiconductor layer capable of absorbing at least a portion of light at the first wavelength. The second semiconductor layer has a band gap energy that is less than a minimum band gap energy of the first semiconductor layer. In some cases, the band gap energy of the first semiconductor layer is greater than the energy of a photon at the second wavelength. In some cases, the band gap energy of the second semiconductor layer is greater than the energy of a photon at the second wavelength. In some cases, the index of refraction of the second semiconductor layer at the second wavelength is greater than the maximum index of refraction of the first semiconductor layer at the second wavelength. In some cases, the band gap energy of the first semiconductor layer is greater than the transition energy of the semiconductor potential well. In some cases, the band gap energy of the second semiconductor layer is greater than the transition energy of the semiconductor potential well. In some cases, the semiconductor light converting construction includes a plurality of semiconductor potential wells having the same transition energy. In some cases, the semiconductor light converting construction includes a plurality of semiconductor potential wells having different transition energies.

In another embodiment, an optical construction includes a first semiconductor layer that has an index of refraction $n_1$ at a first wavelength in the visible; a second semiconductor layer that is disposed on the first semiconductor layer and has an index of refraction $n_2$ at the first wavelength, where $n_2$ is smaller than $n_1$; a third semiconductor layer that is disposed on the second semiconductor layer and has an index of refraction $n_3$ at the first wavelength, where $n_3$ is greater than $n_2$; a structured layer that is disposed directly on the third semiconductor layer; and an overcoat that is disposed directly on at least a portion of the structured layer. The optical construction is substantially transmissive at the first wavelength. In some cases, the overcoat includes a photonic crystal. In some cases, the first semiconductor layer is a potential well. In some cases, the second semiconductor layer is substantially light absorbing at the first, but not the second, wavelength. In some cases, the third semiconductor layer is substantially light absorbing at the first, but not the second, wavelength.

In another embodiment, a light emitting system includes a light source that emits light at a first wavelength and a longer second wavelength; one or more first semiconductor light absorbing layers that are capable of absorbing light at the first, but not the second, wavelengths. The one or more first semiconductor light absorbing layers absorb at least 80% of light emitted by the light source. The light emitting system further includes a semiconductor potential well that converts at least a portion of light absorbed by the one or more first semiconductor light absorbing layers to a longer wavelength output light; and one or more second semiconductor light absorbing layers that are capable of absorbing light at the second wavelength. The one or more second semiconductor light absorbing layers absorb the remaining light emitted by the light source. In some cases, the one or more first semiconductor light absorbing layers absorb at least 90% of light emitted by the light source. In some cases, the one or more first semiconductor light absorbing layers absorb at least 95% of light emitted by the light source. In some cases, the light emitting system includes a plurality of semiconductor potential wells having the same or different transition energies.

In another embodiment, a semiconductor light converting construction includes a first semiconductor layer that has a band gap energy $E_{abs}$ for absorbing a portion, but not all, of an incident light; a semiconductor potential well that has a transition energy $E_{tr}$ less than $E_{abs}$ for down converting at least a portion of the absorbed incident light; and a second semiconductor layer that has a band gap energy $E_{lb}$ less than $E_{abs}$ and greater than $E_{tr}$ for absorbing the remaining incident light. In some cases, the portion of the incident light absorbed by the first semiconductor layer and the remaining incident light absorbed by the second semiconductor layer include different wavelength regions of the spectrum. In some cases, the semiconductor light converting construction further includes a semiconductor window that has a band gap energy $E_w$ greater than $E_{abs}$. In some cases, $E_w$ is greater than the photon energy of the incident light. In some cases, the first semiconductor layer is closely adjacent the semiconductor potential well. In some cases, the first semiconductor layer is immediately adjacent the semiconductor potential well. In some cases, the first semiconductor layer is disposed between the semiconductor potential well and the second semiconductor layer. In some cases, each of the first and second semiconductor layers is immediately adjacent the semiconductor potential well.

In another embodiment, a method of fabricating an optical construction for extracting light from a substrate includes the steps of: (a) providing a substrate that has a surface; (b) disposing a plurality of structures on the surface of the substrate, where the plurality of structures form open areas that expose the surface of the substrate; (c) shrinking at least some of the structures; and (d) applying an overcoat to cover the shrunk structures and the surface of the substrate in the open areas. In some cases, step (c) is carried out by applying an etchant to the plurality of structures. In some cases, the percent coverage of the surface of the substrate by the plurality of the structures decreases after applying the etchant. In some cases, the plurality of structures include polystyrene. In some cases, the plurality of structures include a plurality of particles. In some cases, the plurality of particles are substantially spherical before applying the etchant and substantially cone-like after applying the etchant. In some cases, steps (a) through (d) are carried out sequentially. In some cases, the method further includes a step of reflowing at least some of the structures, wherein, in some cases, the step of reflowing at least some of the structures is carried out by applying heat to the plurality of the structures. In some cases, the steps of shrinking and reflowing at least some of the particles are carried out simultaneously. In some cases, the structures are shrunk at least 20%, or at least 40%, in step (c). In some cases, the overcoat in step (d) includes a structured overcoat. In some cases, the overcoat in step (d) has an outer structured surface that conforms to the outer surface of the plurality of the structures.

In another embodiment, a method of fabricating a plurality of structures on a surface of a substrate for extracting light from the substrate includes the steps of: (a) providing a substrate that has a surface; (b) ascertaining a desired first percent area coverage of the surface of the substrate; (c) disposing a plurality of structures on the surface of the substrate that result in a second percent area coverage that is greater than the desired first percent area coverage; and (d) shrinking at least some of the structures to reduce the percent area coverage to the desired first percent area coverage. In some cases, the method further includes the step of applying a structured overcoat to cover the shrunk structures and the surface of the substrate in the uncovered areas. In some cases, the method further includes the step of reflowing at least some of the plurality of the structures.

In another embodiment, a light converting construction includes a phosphor slab that has a first index of refraction for converting at least a portion of light at a first wavelength to light at a longer second wavelength; and a structured layer that is disposed on the phosphor slab and has a second index of refraction smaller than the first index of refraction. The structured layer includes a plurality of structures that are disposed directly on the phosphor slab and a plurality of openings that expose the phosphor slab. The light converting construction further includes a structured overcoat that is disposed directly on at least a portion of the structured layer and a portion of the phosphor slab in the plurality of openings. The structured overcoat has a third index of refraction that is greater than the second index of refraction. In some cases, the structured overcoat enhances extraction of light at the second wavelength from the phosphor slab. In some cases, the structured overcoat includes at least one of $Si_3N_4$, ZnS, ZnSe, ZnSSe, ITO, $TiO_2$, $ZrO_2$, $Ta_2O_5$, $HfO_2$, and silicate. In some cases, the difference between the first and second indices of refraction is at least 0.3, or at least 0.5, or at least 0.7, or at least 0.9. In some cases, the difference between the third and second indices of refraction is at least 0.3, or at least 0.5, or at least 0.7, or at least 0.9. In some cases, the structured outer surface of the structured overcoat conforms to the outer surface of the structured layer. In some cases, the light converting construction further includes an encapsulant that encapsulates the light converting construction. In some cases, the index of refraction of the structured overcoat at the second wavelength is in a range from about 1.35 to about 2.2.

BRIEF DESCRIPTION OF DRAWINGS

The invention may be more completely understood and appreciated in consideration of the following detailed description of various embodiments of the invention in connection with the accompanying drawings, in which.

The same reference numeral used in multiple figures refers to the same or similar elements having the same or similar properties and functionalities.

DETAILED DESCRIPTION

This application discloses semiconductor light emitting devices that include a semiconductor light source and one or more wavelength converters, where the converter can be a semiconductor wavelength converter. The application further discloses structures for enhancing light extraction.

Some disclosed devices have a light source and a light converting layer from the same semiconductor group, such as the III-V group. In such cases, it may be feasible to monolithically grow and fabricate, for example, a III-V wavelength converter directly onto a III-V light source, such as a III-V LED. In some cases, however, a wavelength converter with a desired output wavelength, high conversion efficiency or other desirable properties, may be from a semiconductor group that is different than the semiconductor group the LED belongs to. In such cases, it may not be possible or feasible to grow one component onto the other with high quality. For example, a high efficiency wavelength converter can be from the II-VI group and a light source, such as an LED, can be from the III-V group. In such cases, various methods can be employed for attaching the light converter to the light source. Some such methods are described in U.S. Patent Application Ser. No. 61/012,608, filed Dec. 10, 2007.

The wavelength converters disclosed in this application down convert light that is emitted by a light source. As used herein, down converting means that the wavelength of the converted light is greater than the wavelength of the unconverted or incident light.

Figure 19:
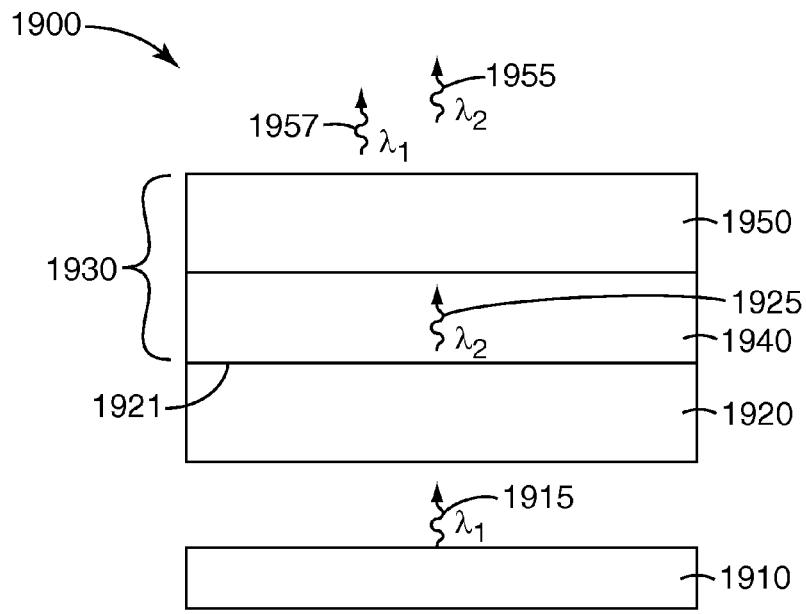
FIG. 19 is a schematic side-view of a light emitting system.

FIG. 19 is a schematic side-view of a light emitting system 1900 that includes a light source 1910, a light converting layer 1920 and a light extracting layer 1930. Light source 1910 emits light 1915 at a first wavelength $\lambda_1$ typically in UV or the blue region of the spectrum. Light converting layer 1920 converts at least a portion of light 1915 to light 1925 at a longer second wavelength $\lambda_2$, typically in the green or red region of the spectrum. Light extracting layer 1930 improves brightness or intensity of the output light of the light emitting system by enhancing extraction of light 1925 from light converting layer 1920. For example, light extracting layer 1930 extracts light that would otherwise be trapped in or otherwise not transmitted by light converting layer 1920.

In general, light converting layer 1920 can include any element or material capable of converting at least a portion of the light at the first wavelength to light at the second wavelength. For example, layer 1920 can include a phosphor, a fluorescent dye, a conjugated light emitting organic material such as a polyfluorene, a photoluminescent semiconductor layer, a semiconductor potential well, or an assembly or a plurality of semiconductor quantum dots. Exemplary phosphors that may be used in a light converting layer 1920 include strontium thiogallates, doped GaN, copper-activated zinc sulfide, and silver-activated zinc sulfide. Other useful phosphors include doped YAG, silicate, silicon oxynitride, silicon nitride, and aluminate based phosphors. Examples of such phosphors include Ce:YAG, SrSiON:Eu, SrBaSiO:Eu, SrSiN:Eu, and BaSrSiN:Eu.

In some cases, light converting layer 1920 can include a slab phosphor such as a Ce:YAG slab. A Ce:YAG slab can be made by, for example, sintering Ce:YAG phosphor particles at elevated temperatures and pressures to form a substantially optically transparent and non-scattering slab as described in, for example, U.S. Pat. No. 7,361,938.

Light extracting layer 1930 includes a structured layer 1940 directly disposed on light converting layer 1920, and an overcoat 1950, such as a structured overcoat 1950, disposed on the structured layer. Structured layer 1940 includes a plurality of structures directly disposed on light converting layer 1920. In some cases, an outer surface of the overcoat conforms to an outer surface of the structured layer.

In some cases, the index of refraction of the structures at $\lambda_2$ is lower than the index of refraction of the outermost layer in light converting layer 1920 at the same wavelength. A low refractive index structured layer 1940 can be formed on output surface 1921 of the light converting layer, for example, by patterning, such as photopatterning, a photoresist on the output surface, or by depositing a partial or complete monolayer of particles, or a multilayer of particles, such as nanoparticles, on the output surface. In some cases, the structured layer can include air, for example, for lowering the index of refraction of the structured layer at $\lambda_2$. For example, in some cases, the structured layer can include hollow structures or particles on output surface 1921. A structured layer 1940 including air or air pockets can be formed on the output surface by, for example, patterning a material, such as an organic material, on the output surface, overcoating the patterned material with an overcoat, and removing portions of the overcoated patterned material to form air regions by, for example, decomposing the portions at elevated temperatures. In some cases, the index of refraction of the structures in structured layer 1940 is less than the index of refraction of the outermost layer in light converting layer 1920 which is immediately adjacent the structured layer.

Overcoat 1950 enhances extraction of light from light converting layer 1920. In some cases, the overcoat can include glassy materials or metal oxides, such as $Al_2O_3$, $TiO_2$, $ZrO_2$, $Ta_2O_3$, $Ta_2O_5$, $HfO_2$, silicate, silicon nitride, silicon oxinitride, or indium-tin oxide. In some cases, the overcoat can be a semiconductor overcoat, such as an overcoat containing ZnS, ZnSe, ZnO or a semiconductor alloy such as $ZnS_xSe_{1-x}$. In some cases, the overcoat can be a sol-gel, such as a densified sol-gel. In some cases, the index of refraction of the overcoat is greater than the index of refraction of the outermost layer in light converting layer 1920 which is immediately adjacent the structured layer.

Figure 1:
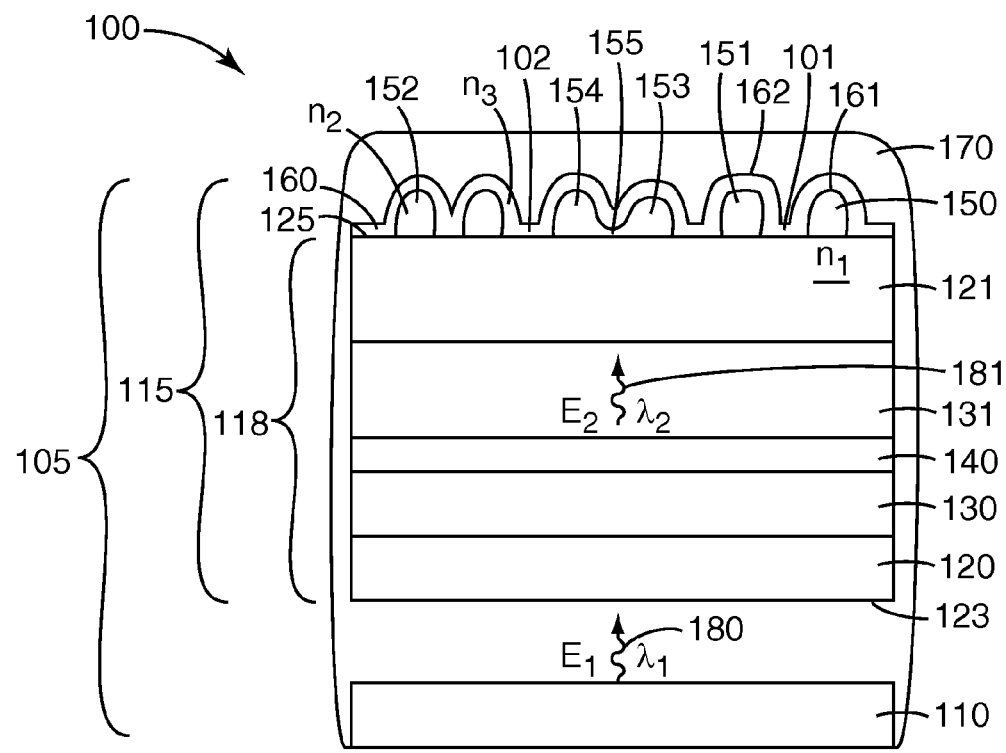
FIG. 1 is a schematic side-view of a light emitting system.

FIG. 1 is a schematic side-view of a semiconductor luminescent element 105 that includes an electroluminescent device 110 that emits light at a first wavelength $\lambda_1$ having a photon energy $E_1$, and a semiconductor light converting construction 115 for converting at least a portion of light at the first wavelength to light at a longer second wavelength $\lambda_2$ having a photon energy $E_2$.

Semiconductor light converting construction 115 includes a first window 120 facing electroluminescent device 110, a first absorbing layer 130 disposed on the first window, a potential well 140 disposed on the first absorbing layer, a second absorbing layer 131 disposed on the potential well, a second window 121 disposed on the second absorbing layer, a structured layer 150 disposed directly on the second window, an overcoat 160 disposed on the structured layer, and an encapsulant 170 disposed on the overcoat and encapsulating semiconductor electroluminescent element 105.

In general, light converter 118 can include any element capable of converting at least a portion of the light at the first wavelength $\lambda_1$ to light at the second wavelength $\lambda_2$. For example, light converter 118 can include a phosphor, a fluorescent dye, a conjugated light emitting organic material such as a polyfluorene. Exemplary phosphors that may be used in light converter 118 include strontium thiogallates, doped GaN, copper-activated zinc sulfide, and silver-activated zinc sulfide.

In some cases, layer 140 can include a potential well, a quantum well, a quantum dot, or multiples or a plurality of each. Inorganic potential and quantum wells, such as inorganic semiconductor potential and quantum wells, typically have increased light conversion efficiencies compared to, for example, organic materials, and are more reliable by being less susceptible to environmental elements such as moisture. Furthermore, inorganic potential and quantum wells tend to have narrower output spectrum resulting in, for example, improved color gamut.

As used herein, potential well means semiconductor layer (s) in a multilayer semiconductor structure designed to confine a carrier in one dimension only, where the semiconductor layer(s) has a lower conduction band energy than the surrounding layers and/or a higher valence band energy than the surrounding layers. Quantum well generally means a potential well which is sufficiently thin that quantization effects increase the energy for electron-hole pair recombination in the well. A quantum well typically has a thickness of about 100 nm or less, or about 10 nm or less. A quantum dot typically has a maximum dimension of about 100 nm or less, or about 10 nm or less.

In some cases, a potential or quantum well 140 includes a II-VI semiconductor potential or quantum well that has a transition energy that that is smaller than the energy $E_1$ of a photon emitted by electroluminescent device 110. In general, the transition energy of a potential or quantum well 140 is substantially equal to the energy $E_2$ of a photon that is re-emitted by the potential or quantum well.

In some cases, potential well 140 can include CdMgZnSe alloys having compounds ZnSe, CdSe, and MgSe as the three constituents of the alloy. In some cases, one or more of Cd, Mg, and Zn, especially Mg, may be absent from the alloy. For example, potential well 140 can include a $Cd_{0.70}Zn_{0.30}Se$ quantum well capable of re-emitting in the red, or a $Cd_{0.33}Zn_{0.67}Se$ quantum well capable of re-emitting in the green. As another example, potential well 140 can include an alloy of Cd, Zn, Se, and optionally Mg, in which case, the alloy system can be represented by Cd(Mg)ZnSe. As another example, potential well 140 can include an alloy of Cd, Mg, Se, and optionally Zn. In some cases, the potential well can include ZnSeTe. In some cases, a quantum well 140 has a thickness in a range from about 1 nm to about 100 nm, or from about 2 nm to about 35 nm.

In general, potential well 140 can have any conduction and/or valence band profile. Exemplary profiles are described in, for example, U.S. Patent Application No. 60/893,804.

In some cases, potential well 140 can be n-doped or p-doped where the doping can be accomplished by any suitable method and by inclusion of any suitable dopant. In some cases, electroluminescent device 110 and potential well 140 can be from two different semiconductor groups. For example, in such cases, electroluminescent device 110 can be a III-V semiconductor device and potential well 140 can be a II-VI potential well. In some cases, electroluminescent device 110 can include AlGaInN semiconductor alloys and potential well 140 can include Cd(Mg)ZnSe semiconductor alloys where a material enclosed in parentheses is an optional material.

In general, semiconductor light converting construction 115 can have one or more potential wells. In some cases, construction 115 can have multiple potential wells. For example, in such cases, construction 115 can have at least 2 potential wells, or at least 5 potential wells, or at least 10 potential wells. In some cases, construction 115 can have at least two potential wells, or at least three potential wells, or at least four potential wells, with different transition energies.

In some cases, potential well 140 substantially absorbs light at the first wavelength $\lambda_1$. For example, in such cases, potential well 140 absorbs at least 30%, or at least 40%, or at least 50% of light at the first wavelength $\lambda_1$. In some cases, potential well 140 is substantially optically transmissive at the first wavelength $\lambda_1$. For example, in such cases, potential well 140 transmits at least 60%, or at least 70%, or at least 80%, or at least 90% of light at the first wavelength $\lambda_1$.

Light absorbing layers 130 and 131 assist in absorption of light 180 and generation of carriers in semiconductor light converting construction 115. In some cases, light absorbing layers 130 and 131 absorb at least a portion of light 180 and, as a result, create photo-generated carrier pairs, such as electron-hole carriers. The carriers diffuse or migrate from the light absorbing layers to potential well 140 where they recombine and emit light at the second wavelength $\lambda_2$.

Light absorbing layers 130 and 131 are placed proximate the potential well so that the photo-generated carriers can efficiently diffuse to the potential wells for recombination of carriers and emission of light at the second wavelength $\lambda_2$.

In some cases, a light absorbing layer in semiconductor light converting construction 115 can be immediately adjacent to potential well 140, meaning that no intervening layer is disposed between the absorbing layer and the potential well. For example, in FIG. 1, each of first and second light absorbing layers 130 and 131 is immediately adjacent potential well 140. In some cases, a light absorbing layer in semiconductor light converting construction 115 can be closely adjacent to potential well 140, meaning that one or a few intervening layers may be disposed between the absorbing layer and the potential well. For example, in some cases, one or more intervening layers, not shown in FIG. 1, can be disposed between first light absorbing layer 130 and potential well 140.

In some cases, the light absorbing layers can include a semiconductor, such as an inorganic semiconductor, such as a II-VI semiconductor. For example, one or more of absorbing layers 130 and 131 can include a Cd(Mg)ZnSe semiconductor alloy.

In some cases, a light absorbing layer has a band gap energy $E_{abs}$ that is smaller than the energy $E_1$ of a photon emitted by electroluminescent device 110. In such cases, the light absorbing layer can absorb, such as strongly absorb, light that is emitted by the electroluminescent device. In some cases, a light absorbing layer has a band gap energy that is greater than the transition energy of potential well 140. In such cases, the light absorbing layer is substantially optically transparent to light 181 that is re-emitted by the potential well at the second wavelength $\lambda_2$.

In some cases, a light absorbing layer, such as second light absorbing layer 131, has a band gap energy that is smaller than the photon energy of light 181 emitted at the second wavelength $\lambda_2$. In such cases, the light absorbing layer can absorb at least a portion of light 181. In such cases, at least a portion of the absorbed light can be down-converted to light at a third longer wavelength $\lambda_3$.

In some cases, at least one light absorbing layer in semiconductor light converting construction 115 is doped with a dopant. In some cases, such as when a light absorbing layer includes a Cd(Mg)ZnSe alloy, the dopant can be a group VII n-type dopant. In some cases, the dopant can include chlorine or iodine. In some cases, the number density of the dopant is in a range from about $10^{17}$ cm$^{-3}$ to about $10^{18}$ cm$^{-3}$. Other exemplary dopants include Al, Ga, In, F, Br, I, and N.

The exemplary semiconductor light converting construction 115 includes two light absorbing layers 130 and 131. In general, the semiconductor light converting construction can have no, one, two, or more than two absorbing layers. In some cases, semiconductor light converting construction 115 can have at least two, or at least three, or at least four, light absorbing layers having different band gap energies.

In general, a light absorbing layer is sufficiently close to a corresponding potential well so that a photo-generated carrier in the light absorbing layer has a reasonable chance of diffusing to the potential well. In cases where the semiconductor multilayer stack does not include light absorbing layers, the potential well(s) can be substantially light absorbing at the first wavelength $\lambda_1$.

First and second windows 120 and 121 are designed primarily to provide barriers so that carriers such as electron-hole pairs that are photo-generated in an absorbing layer and/or potential well, have no, or very little, chance to migrate to a free or an external surface in construction 115. For example, first window 120 is designed primarily to prevent carriers generated in first absorbing layer 130 from migrating to surface 123 where they can recombine non-radiatively. In some cases, windows 120 and 121 have band gap energies $E_w$ that are greater than the energy $E_1$ of a photon emitted by electroluminescent device 110. In such cases, windows 120 and 121 are substantially optically transparent to light emitted by electroluminescent device 110 and light re-emitted by potential well 140.

The exemplary semiconductor light converting construction 115 includes two windows. In general, a light converting construction can have no, one, or two windows. For example, in some cases, semiconductor light converting construction 115 can have a single window disposed between electroluminescent device 110 and potential well 140, or between electroluminescent device 110 and absorbing layer 130.

In some cases, the location of an interface between two adjacent layers in semiconductor light converting construction 115 may be a well-defined or sharp interface. In some cases, such as when the material composition within a layer changes as a function of distance along the thickness direction, the interface between two adjacent layers may not be well defined and may, for example, be a graded interface defining a graded region. For example, in some cases, first absorbing layer 130 and first window 120 can have the same material components but with different material concentrations. In such cases, the material composition of the absorbing layer may be gradually changed to the material composition of the window layer resulting in a graded interface or region between the two layers. For example, in cases where both layers include Mg, the concentration of Mg can be increased when gradually transitioning from the absorbing layer to the window.

Second window 121 has an index of refraction $n_1$ in a wavelength region of interest that includes wavelengths $\lambda_2$. In some cases, $\lambda_1$ is a UV or blue wavelength and $\lambda_2$ is a visible wavelength in a range from about 420 nm to about 650 nm. In such cases, $n_1$ can be an index in the visible range of the spectrum. In some cases, $n_1$ is the index at or near wavelength $\lambda_2$.

In the exemplary semiconductor light converting construction 115, second window 121 is disposed on potential well 140 and forms an outer layer 121 of the semiconductor light converting construction and the outermost layer in light converter 118. Structured layer 150 has an index of refraction $n_2$ at, for example, $\lambda_2$ and is disposed directly on outer layer or second window 121. Index $n_2$ is smaller than index $n_1$ of second window 121. In some cases, the difference between $n_1$ and $n_2$ is at least 0.2, or at least 0.3, or at least 0.4, or at least 0.5, or at least 0.6, or at least 0.7, or at least 0.8, or at least 0.9.

Structured layer 150 includes a plurality of structures, such as structures 151-154. Some structures in the plurality of the structures can be discrete, such as structures 151 and 152. Some structures can be connected through a base, such as structures 153 and 154 connected to each other through base 155. Structured layer 150 includes a plurality of openings, such as openings 101 and 102, that expose second window 121.

In some cases, structured layer 150 is substantially optically transparent at the second wavelength $\lambda_2$. For example, in such cases, the total optical transmittance of the structured layer at wavelength $\lambda_2$ is at least 50%, or at least 60%, or at least 70%, or at least 80%.

In some cases, the plurality of structures in structured layer 150 form a regular array of structures. In some cases, the structures are placed randomly across top surface 125 of second window 121. In some cases, structured layer 150 is a continuous layer that includes a plurality, or an array, of connected structures with openings in between at least some of the structures similar to, for example, a waffle pattern.

Figure 3:
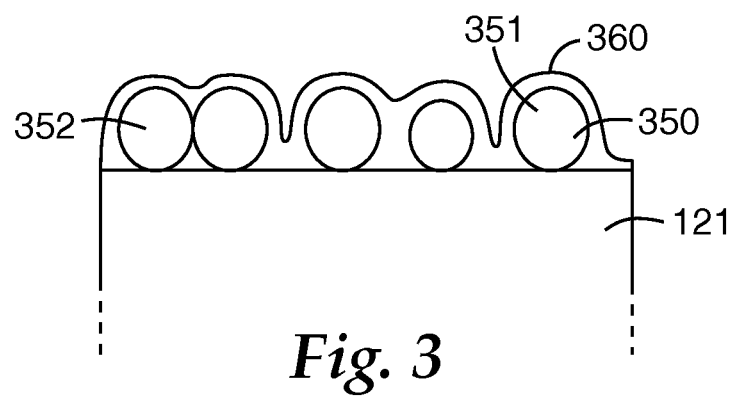
FIG. 3 is a schematic side-view of another structured layer and another overcoat.

In some cases, the plurality of structures in structured layer 150 form a plurality of discrete structures. For example, in some cases, the structured layer can include a plurality of particles. For example, structured layer 350 in FIG. 3 has a plurality of particles, such as particles 351 and 352. In some cases, the particles are substantially microparticles or nanoparticles. For example, in such cases, the average size of a particle is no more than 2000 nm, or no more than 1500 nm, or no more than 1000 nm, or no more than 750 nm. The particles in structured layer 350 can have any shape, such as any regular or irregular shape.

In some cases, structured layer 150 in FIG. 1 includes a plurality of particles where a substantial fraction of the particles are substantially spherical. For example, in such cases, the ratio of a largest dimension to a smallest dimension of a particle is no more than 1.3, or no more than 1.25, or no more than 1.2, or no more than 1.15, or no more than 1.1.

In some cases, structured layer 150 can include an organic material, such as a patternable or photo patternable organic material or polymer, such as a photoresist. In some cases, structured layer 150 can include polystyrene, such as polystyrene microspheres. In some cases, structured layer 150 can include an inorganic material, such as a metal oxide or a glass. Examples of inorganic materials include $SiO_2$, $GeO_2$, $Al_2O_3$, $MgF_2$, and silicate glasses.

In some cases, structured layer 150 can include a single or a monolayer of structures closely packed across top surface 125. In some cases, structured layer 150 can include a sub-monolayer of structures, meaning that the structures are not closely packed and/or there are areas substantially larger than the nominal or average size of the structures that include no or very few structures. In such cases, the open areas in the sub-monolayer structured layer 150 can be substantially larger than the average size of a single structure, such as a single particle.

Figure 4:
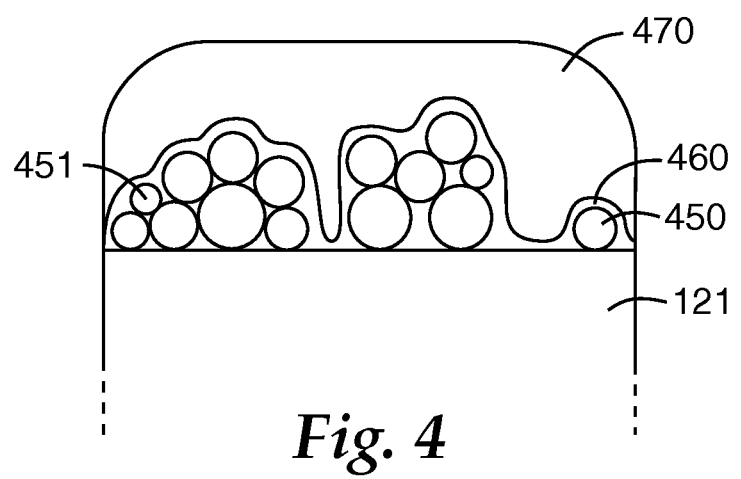
FIG. 4 is a schematic side-view of another structured layer and another overcoat.

In some cases, structured layer 150 can include multi-layers of structures. For example, FIG. 4 is a schematic side-view of a structured layer 450 disposed directly on second window 121 that includes multi-layers of particles 451. The structured layer is coated with a continuous overcoat 460 and an encapsulant 470 covers the overcoat.

Structured overcoat 160 is disposed directly on at least a portion of structured layer 150 and a portion of second window 121 in the areas where the window is exposed through the openings in structured layer 150. Overcoat 160 has a third index of refraction $n_3$ at, for example, wavelength $\lambda_2$ that is greater than the second index of refraction $n_2$. In some cases, $n_3$ is smaller than $n_1$. In some cases, $n_3$ is greater than $n_1$. In some cases, the difference between $n_3$ and $n_2$ is at least 0.2, or at least 0.3, or at least 0.4, or at least 0.5, or at least 0.6, or at least 0.7, or at least 0.8, or at least 0.9.

In some cases, overcoat 160 can extract light 181 that would otherwise be totally internally reflected at surface 125 of the second window. In such cases, the overcoat enhances extraction of light 181 at the second wavelength $\lambda_2$ from semiconductor light converting construction 115.

In some cases, an outer surface 162 of structured overcoat 160 substantially conforms with an outer surface 161 of structured layer 150. For example, in some cases, overcoat 160 can be disposed on structured layer 150 using a vacuum deposition technique. In such cases, outer surface 162 can conform to outer surface 161. In some cases, the average thickness of structured overcoat is not greater than the average size of the structures in structured layer 150. In some cases, the average thickness of overcoat 160 is no more than 1000 nm, or no more than 800 nm, or no more than 700 nm, or no more than 600 nm, or no more than 500 nm, or no more than 400 nm.

In some cases, overcoat 160 is substantially optically transparent at the second wavelength $\lambda_2$. For example, in such cases, the total optical transmittance of the overcoat at wavelength $\lambda_2$ is at least 50%, or at least 60%, or at least 70%, or at least 80%.

Figure 2:
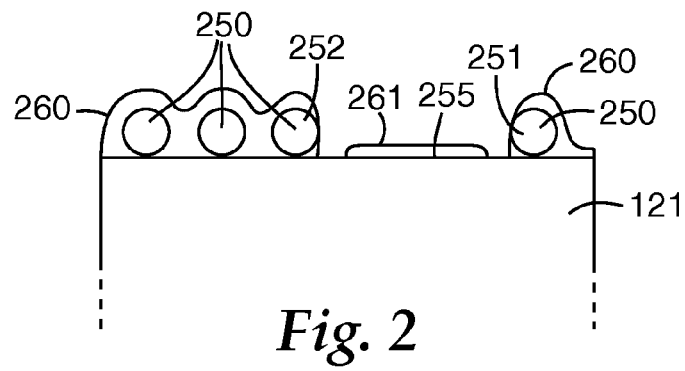
FIG. 2 is a schematic side-view of a structured layer and an overcoat.

In some cases, overcoat 160 can be a discontinuous layer by, for example, including one or more islands. For example, in FIG. 2, structured layer 250 is directly disposed on second window 121 and defines an opening 255 between structures 251 and 252. Overcoat 260 is directly disposed on structured layer 250 and, in the open areas, on second window 121 forming an island 261 in open and exposed area 255. In some cases, overcoat 160 can be a continuous layer. For example, in FIG. 3, overcoat 360 directly disposed on structured layer 350 forms a continuous layer.

In some cases, overcoat 160 can include a semiconductor, a metal oxide, or a ceramic. In some cases, the overcoat can include at least one of $Si_3N_4$, silicon oxinitride, silicate, ZnS, ZnSe, ZnTe, ZnSSe, ZnSeTe, ZnSTe, CdS, CdSe, CdSSe, ITO, $TiO_2$, $ZrO_2$, $Ta_2O_5$, and $HfO_2$.

Encapsulant 170 is disposed on overcoat 160 and encapsulates semiconductor luminescent element 105 and protects the element from, for example, moisture in the environment. In some cases, the encapsulant can have an optical function, such as an optical power for, for example, collimating light 181 as it exits the semiconductor luminescent element.

Electroluminescent device 110 can be any device capable of emitting light in response to an electrical signal. For example, an electroluminescent device can be a light emitting diode (LED) or a laser diode capable of emitting photons in response to an electrical current. An LED electroluminescent device 110 can emit light at any wavelength that may be desirable in an application. For example, the LED can emit light at a UV wavelength, a visible wavelength, or an IR wavelength. In some cases, the LED can be a short-wavelength LED capable of emitting UV photons. In general, the LED can be composed of any suitable materials, such as organic semiconductors or inorganic semiconductors, including Group IV elements such as Si or Ge; III-V compounds such as InAs, AlAs, GaAs, InP, AlP, GaP, InSb, AlSb, GaSb, GaN, AlN, InN and alloys of III-V compounds such as AlGaInP and AlGaInN; II-VI compounds such as ZnSe, CdSe, BeSe, MgSe, ZnTe, CdTe, BeTe, MgTe, ZnS, CdS, BeS, MgS and alloys of II-VI compounds, or alloys of any of the compounds listed above.

In some cases, electroluminescent device 110 can include one or more p-type and/or n-type semiconductor layers, one or more active layers that may include one or more potential and/or quantum wells, buffer layers, substrate layers, and superstrate layers. In some cases, electroluminescent device 110 can be a III-V semiconductor light source, such as a III-V LED, and may include AlGaInN semiconductor alloys. For example, electroluminescent device 110 can be a GaN based LED. As another example, electroluminescent device 110 can be a II-VI LED, such as a ZnO based LED.

Some of the advantages of the disclosed constructions are further illustrated by the following examples. The particular materials, amounts and dimensions recited in this example, as well as other conditions and details, should not be construed to unduly limit the present invention.

Example 1

A semiconductor light converting construction similar to light converter 118 in FIG. 1 was fabricated. The relative layer sequence and estimated values of material composition and thickness for the different layers are summarized in Table I.

TABLE I

Details of various layers in the construction of Example 1:

| Layer No. | Material | Thickness (Å) | Description |
|---|---|---|---|
| 1 | InP | — | Substrate |
| 2 | $Ga_{0.47}In_{0.53}As$ | 2000 | Buffer |
| 3 | $Cd_{0.37}Mg_{0.22}Zn_{0.41}Se$ | 10924 | Absorber |
| 4 | $Cd_{0.47}Zn_{0.53}Se$ | 20 | Quantum well |
| 5 | $Cd_{0.37}Mg_{0.22}Zn_{0.41}Se$ | 1178 | Absorber |
| 6 | $Cd_{0.47}Zn_{0.53}Se$ | 20 | Quantum well |
| 7 | $Cd_{0.37}Mg_{0.22}Zn_{0.41}Se$ | 1178 | Absorber |
| 8 | $Cd_{0.47}Zn_{0.53}Se$ | 20 | Quantum well |
| 9 | $Cd_{0.37}Mg_{0.22}Zn_{0.41}Se$ | 1178 | Absorber |
| 10 | $Cd_{0.47}Zn_{0.53}Se$ | 20 | Quantum well |
| 11 | $Cd_{0.37}Mg_{0.22}Zn_{0.41}Se$ | 589 | Absorber |
| 12 | Absorber side: $Cd_{0.37}Mg_{0.22}Zn_{0.41}Se$ Window side: $Cd_{0.22}Mg_{0.44}Zn_{0.34}Se$ | 2500 | Grading layer |
| 13 | $Cd_{0.22}Mg_{0.44}Zn_{0.34}Se$ | 5000 | Window |

A GaInAs buffer layer was first grown by molecular beam epitaxy (MBE) on an InP substrate to prepare a surface for II-VI growth. The construction was then moved through an ultra-high vacuum transfer system to another MBE chamber for growth of the II-VI epitaxial layers for light conversion. Converter 118 included four CdZnSe quantum wells 140. Each quantum well 140 was sandwiched between CdMgZnSe absorbing layers 130 and 131 that could absorb blue light at 440 nm emitted by a GaInN based laser diode.

The InP substrate was removed with a solution of 3HCl:1H$_2$O after the construction was adhesively attached to a glass microscope slide. The etchant stopped at the GaInAs buffer layer (layer #2). The buffer layer was subsequently removed in an agitated solution of 30 ml ammonium hydroxide (30% by weight), 5 ml hydrogen peroxide (30% by weight), 40 g adipic acid, and 200 ml water, leaving only the II-VI light converter 118 attached to the microscope slide.

Example 2

The external quantum efficiency (EQE) of the construction made in Example 1 was calculated when the construction was illuminated from the window side of the construction with a laser diode emitting blue light at $\lambda_{in}$=440 nm. The measured re-emitted wavelength was $\lambda_{out}$=539 nm. EQE was calculated from the expression $(P_{out}/P_{in}) \times (\lambda_{in}/\lambda_{out})$ where $P_{in}$ was the incident power and $P_{out}$ was the output power of the converted light exiting the construction. The calculated EQE was 23%.

Example 3

Figure 5A:
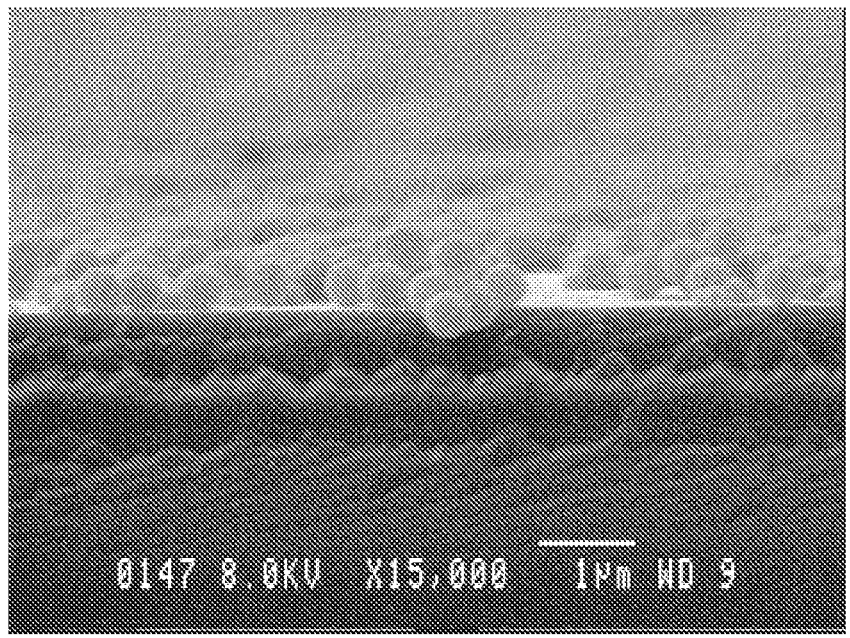
FIGS. 5A and 5B are scanning electron microscope (SEM) images of a single layer of nano-particles and a multilayer of nano-particles, respectively.
Figure 5B:
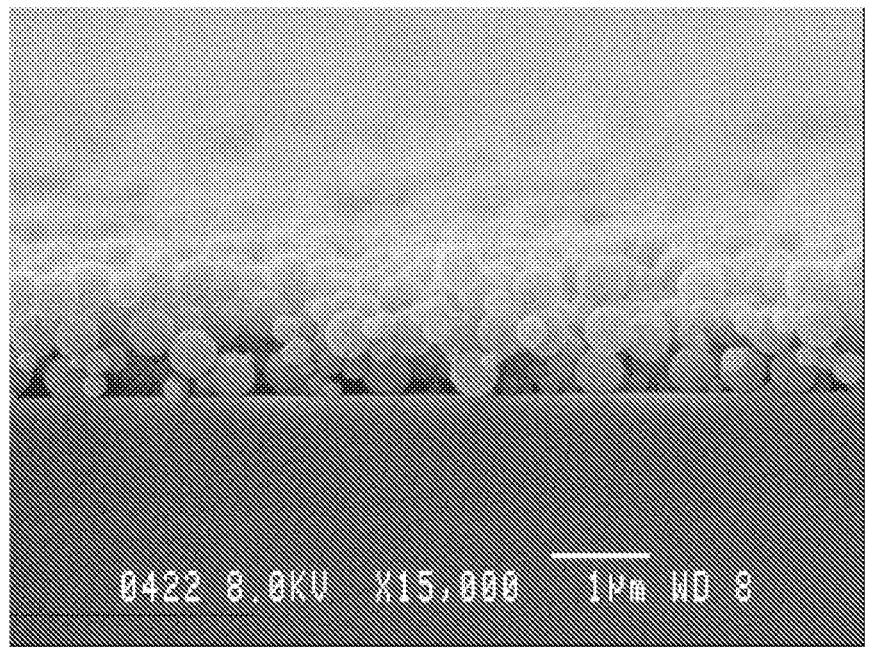

The absorber side of the construction made in Example 1 was coated with SiO$_2$ nano-particles resulting in a structured layer similar to structured layer 150. The particles had an average diameter of about 440 nm and were obtained from Nissan Chemical America Corporation (Houston, Tex.). The particles were dispersed in 1-methoxy-2-propanol to 5% solid content by weight. The solution was coated on the construction using a dip coating method at a speed of about 65 mm/min. One such sample (sample A) was dip coated a single time. A second such sample (sample B) was dip coated several times. FIGS. 5A and 5B are side-view scanning electron microscope (SEM) images of samples A and B, respectively.

Using the process outlined in Example 2, EQE of samples A and B were calculated to be 30.7% and 38.2%, respectively.

Example 4

Figure 6A:
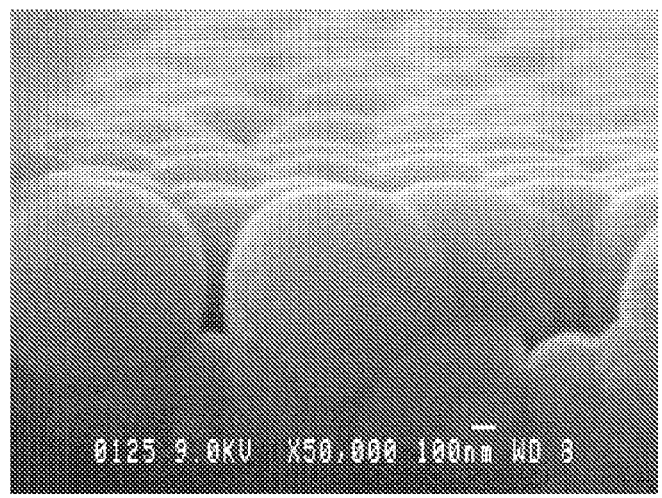
FIGS. 6A and 6B are SEM images of an over coated single layer of nano-particles and an over coated multilayer of nano-particles, respectively.
Figure 6B:
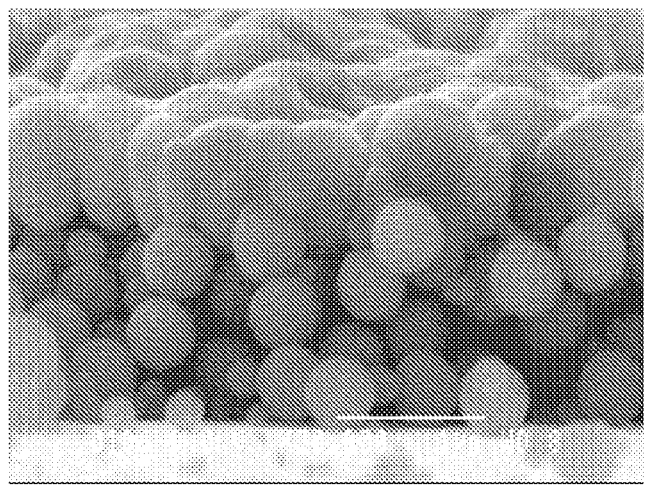

Samples A and B from Example 3 were coated with a Si$_3$N$_4$ overcoat, using a plasma enhanced chemical vapor deposition (PECVD) process resulting in overcoated samples A$_1$ and B$_1$, respectively. The thickness of the overcoat was about 300 nm and the refractive index of the Si$_3$N$_4$ was about 1.8. FIGS. 6A and 6B are side-view SEM images of the over coated samples A$_1$ and B$_1$, respectively. Using the process outlined in Example 2, EQE of samples A$_1$ and B$_1$ were calculated to be 41.2% and 41.5%, respectively. In the case of a single-dip particle coated sample, the addition of the Si$_3$N$_4$ overcoat increased the EQE from 30.7% to 41.2%, an increase of about 34%. In the case of a multiple-dip particle coated sample, the addition of the Si$_3$N$_4$ overcoat increased the EQE from 38.2% to 41.5%, an increase of about 8.6%.

Example 5

The process outlined in Example 3 was repeated to make new sample C (single dip). Using the process outlined in Example 2, the calculated EQE of sample C was 33.45%.

Figure 7:
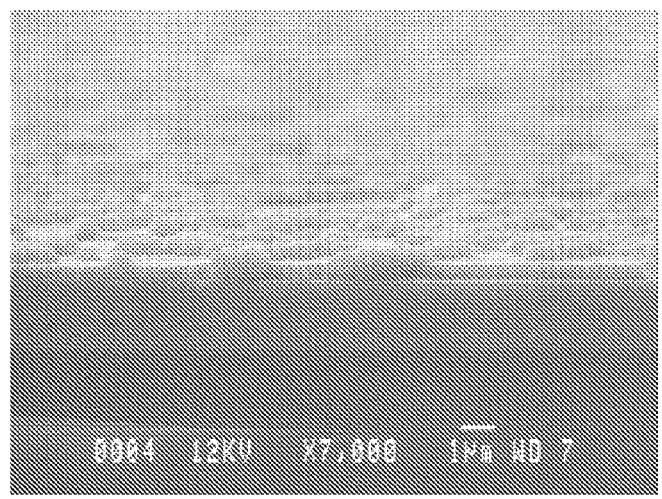
FIG. 7 is an SEM image of another over coated single layer of nano-particles.

Next, sample C was overcoated with ZnS using a vacuum sublimation process resulting in an overcoated sample C$_1$. The thickness of the overcoat was about 400 nm and the refractive index of the ZnS overcoat was estimated to be 2.4. FIG. 7 is a side-view SEM image of sample C$_1$. Using the process outlined in Example 2, the calculated EQE of sample C$_1$ was 45.13%. Hence, the addition of the ZnS overcoat increased the EQE from 33.45% to 45.13%, an increase of about 34.9%.

Example 6

The process outlined in Example 1 was repeated to make new samples D$_1$-D$_4$. Using the process outlined in Example 2, the calculated EQE of samples D$_1$-D$_4$ were 22.1%, 19.93%, 21.25% and 25.7%, respectively. Next, using the process outlined in Example 3, the samples were coated with a monolayer of SiO$_2$ particles at different dipping speeds. The resulting estimated percent area coverage for samples D$_1$-D$_4$ were 30%, 40%, 50% and 70%, respectively. The calculated EQE for the resulting samples were 29.47%, 33.45%, 31.76% and 41.5%, respectively. Hence, the addition of the SiO$_2$ particles, increased the EQE of samples D$_1$-D$_4$ by 33%, 68%, 49% and 61%, respectively.

Figure 8:
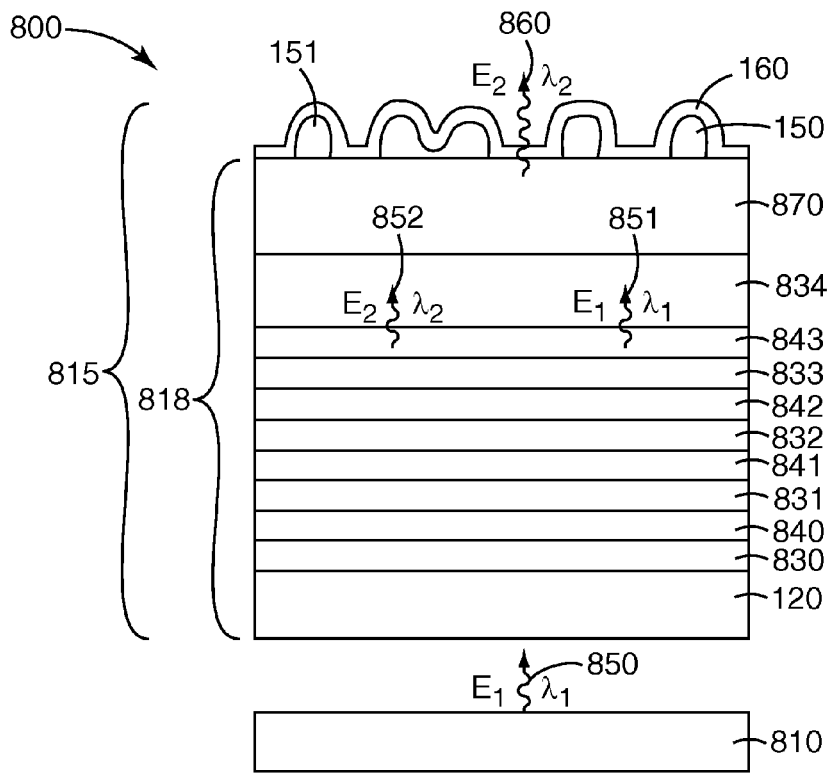
FIG. 8 is a schematic side-view of a light emitting system.

FIG. 8 is a schematic side-view of a light emitting system 800 that includes a light source, such as an LED, 810 that emits light 850 at the first wavelength $\lambda_1$ having the photon energy E$_1$, and a semiconductor light converting construction 815 for converting at least a portion of light at the first wavelength to light at $\lambda_2$ having a photon energy E$_2$.

Semiconductor light converting construction 815 includes a light converter 818, structured layer 150 directly disposed on construction 818, and overcoat 160, such as a structured overcoat 160, disposed on the structured layer.

Light converter 818 includes first window 120 facing light source 810; respective first, second, third, and fourth potential wells 840, 841, 842, and 843; respective first, second, third, fourth and fifth light absorbing layers 830, 831, 832, 833, and 834 surrounding the four potential wells; and an auxiliary light absorbing layer 870.

Light absorbing layers 830-834 are similar to light absorbing layers 130 and 131, and absorb at least a portion of light 850 and, as a result, create photo-generated carriers, such as photo-generated electron-hole pairs, that diffuse or migrate from the light absorbing layers to potential wells 840-843 where they recombine and emit light at the second wavelength $\lambda_2$. Light absorbing layers 830-834 are placed proximate the potential wells so that the photo-generated carriers can efficiently diffuse to the potential wells for recombination of carriers and emission of light 852 at the second wavelength $\lambda_2$. In some cases, light absorbing layers 830-834 have a lower index of refraction at, for example, the second wavelength than potential wells 840-843.

Figure 9:
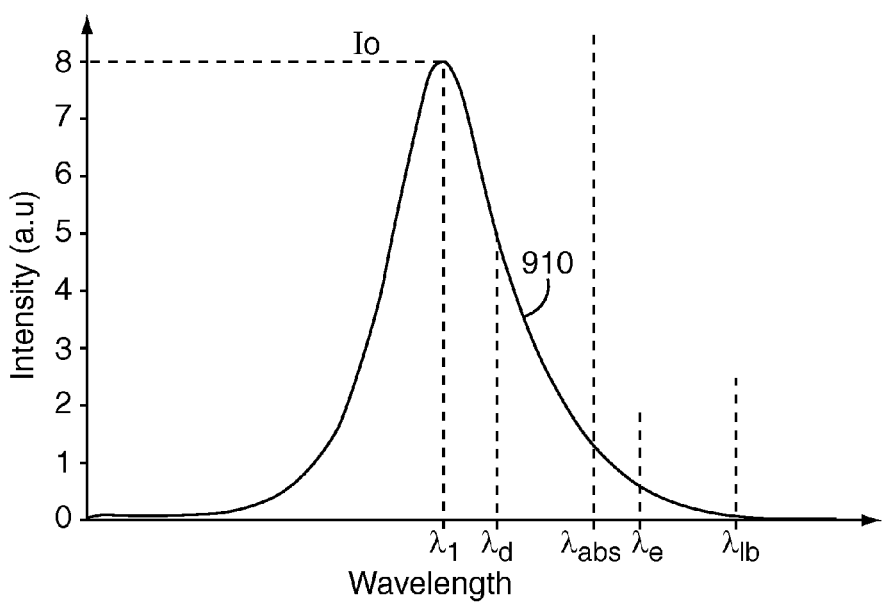
FIG. 9 is a schematic intensity spectrum of an emitted light.
Figure 10:
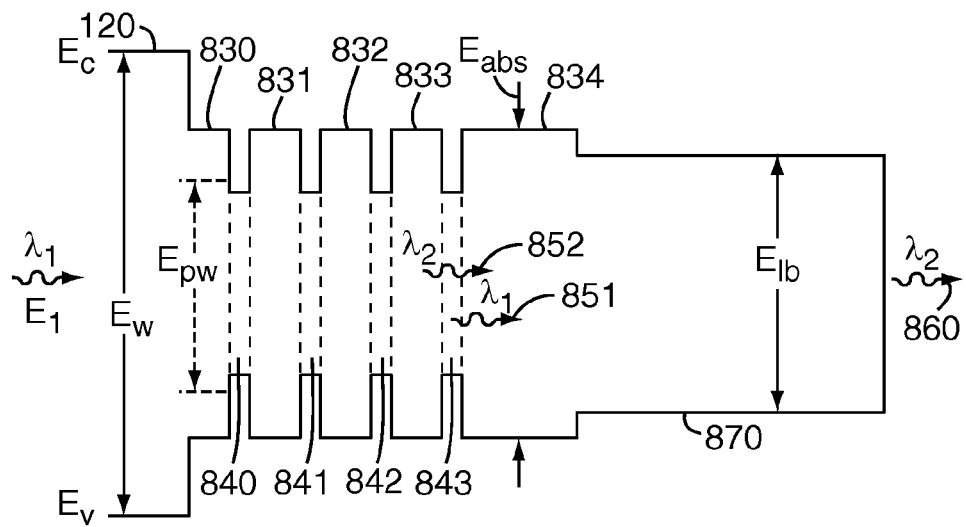
FIG. 10 is a schematic band diagram of a light converter.

In some cases, a portion of light 850 is not absorbed by absorbing layers 830-834 and/or potential wells 840-843 and is transmitted by the absorbing layers and the potential wells as light 851. For example, in some cases, emitted light 850 can have an intensity spectrum 910 shown schematically in FIG. 9, where the horizontal axis is wavelength and the vertical axis is intensity in arbitrary units. In such cases, the wavelength $\lambda_1$ can be the peak emission wavelength having a peak intensity $I_o$, and the band gap wavelength of light absorbing layers 830-834 can be at, for example, $\lambda_{abs}$ sufficiently greater than $\lambda_1$ so that a substantial portion of light 850 is absorbed by the absorbing layers. In some cases, $\lambda_{abs}$ is sufficiently small so as to provide sufficient confinement, even at elevated temperatures, for the photo-generated carrier pairs that diffuse to the potential wells. In such cases, a portion of light 850, generally corresponding to the tail end of spectrum 910 that is located to the right of $\lambda_{abs}$ in FIG. 9, is not absorbed by light absorbing layers 830-834 and/or potential wells 840-843 and is transmitted by the light absorbing layers and the potential wells as light 851 at the first wavelength. In such cases, auxiliary light absorbing layer 870 can absorb the residual or remaining light 851 that is not absorbed by other layers. In some cases, the band gap wavelength $\lambda_{lb}$ of auxiliary light absorbing layer 870 is sufficiently larger than $\lambda_{abs}$, so that essentially all of light 851 is absorbed by the auxiliary light absorbing layer. In such cases, output light 860 of light emitting system 800 is essentially at $\lambda_2$ and has no, or very little, light content at $\lambda_1$. In such cases, the band gap energy $E_{lb}$ of the auxiliary light absorbing layer is smaller than the band gap energy $E_{abs}$ of light absorbing layers 830-834. For example, FIG. 10 is a schematic band diagram of light converter 818 from FIG. 8 showing a smaller $E_{lb}$ and a larger $E_{abs}$. In FIG. 10, $E_c$ and $E_v$ represent conduction and valence bands, respectively. In some cases, such as when it is desirable to optimize light intensity of output light 860, the band gap energy $E_{lb}$ of the auxiliary light absorbing layer is greater than the transition energy of potential wells 840-843 as shown in FIG. 10. In such cases, $E_{lb}$ is greater than energy $E_2$ of a photon at $\lambda_2$.

In some cases, such as when the band gap energy of auxiliary light absorbing layer 870 is smaller than the band gap energy $E_{abs}$ of fifth absorbing layer 834, the index of refraction of auxiliary light absorbing layer 870 at wavelength $\lambda_2$ is greater than the index of refraction of light absorbing layer 834. In such cases, the electric field of an optical mode at $\lambda_2$ waveguiding or trapped in light converter 818 moves towards structured layer 150. This can result in an evanescent tail of the optical mode extending farther into structured layer 150 and/or overcoat 160, in turn, resulting in enhanced extraction of light 852 by the structured layer and the overcoat.

In some cases, a pump light source 810 (see FIGS. 8 and 9) emits light at a first wavelength $\lambda_d$ and a longer second wavelength $\lambda_e$. The first wavelength can, in some cases, be the peak emission wavelength $\lambda_1$ of the pump light source. Light absorbing layers 830-834 are capable of absorbing light at wavelength $\lambda_d$. But the light absorbing layers are not capable of absorbing light at wavelength $\lambda_e$ because $\lambda_e$ is longer than the band gap wavelength $\lambda_{abs}$ of the light absorbing layers. In some cases, the light absorbing layers can absorb a substantial portion of light 850. For example, in such cases, the light absorbing layers are capable of absorbing at least 80%, or at least 85%, or at least 90%, or at least 95% of light 850. Potential wells 840-843 convert at least a portion of the light absorbed by the light absorbing layers to a longer wavelength output light 860. Auxiliary light absorbing layer 870 is capable of absorbing light at the first wavelength $\lambda_d$ and the second wavelength $\lambda_e$ and absorbs the remaining light emitted by light source 810.

In some cases, semiconductor light converting construction 815 can include means other than, or in addition to, the structures in structured layer 150 and overcoat 160 to extract light from auxiliary light absorbing layer 870. For example, light can be extracted by patterning or texturing, for example roughening, the top surface of the auxiliary light absorbing layer. As another example, light can be extracted by forming a photonic crystal on the exterior surface of the auxiliary light absorbing layer. Exemplary photonic crystals are described in, for example, U.S. Pat. Nos. 6,987,288 and 7,161,188. In some cases, light can be extracted by forming an optical element on the output surface of the auxiliary light absorbing layer, where the optical element can be any element and can have any shape capable of extracting at least a portion of light that would otherwise not exit the auxiliary light absorbing layer due to, for example, total internal reflection. Exemplary light extractors are described in, for example, commonly-owned U.S. Patent Publication No. 2007/0284565; commonly-owned U.S. Provisional Patent Application No. 60/866,265, filed on Nov. 17, 2006; and commonly-owned U.S. Provisional Patent Application No. 60/804,544, filed on Jun. 12, 2006.

Figure 11:
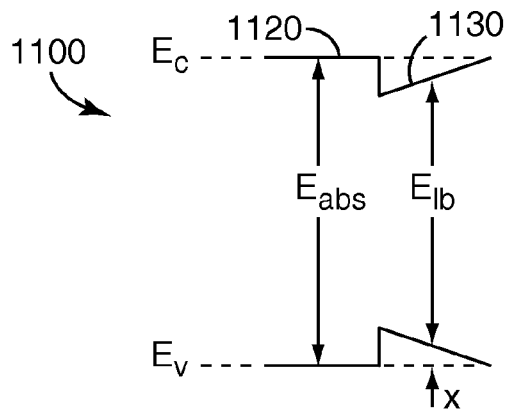
FIG. 11 is a schematic band diagram of another light converter.

In some cases, at least one of light absorbing layer 834 and auxiliary light absorbing layer 870 can be a graded material. In such cases, the band gap energy $E_{lb}$ of the auxiliary light absorbing layer 870 at, at least, one location along the thickness direction of the absorbing layer is smaller than the minimum band gap energy of light absorbing layer 834. For example, FIG. 11 is a schematic band diagram of a light converter 1100 that includes a light absorbing layer 1120 with a constant band gap energy $E_{abs}$ and a linearly graded auxiliary light absorbing layer 1130. The band gap energy $E_{lb}$ of auxiliary light absorbing layer 870 at location "X" is smaller than band gap energy $E_{abs}$ of light absorbing layer 834. In some cases, the index of refraction of auxiliary light absorbing layer 870 at $\lambda_2$ at, at least, one location along the thickness direction of the layer is greater than the maximum index of refraction of light absorbing layer 834 at $\lambda_2$.

Figure 12:
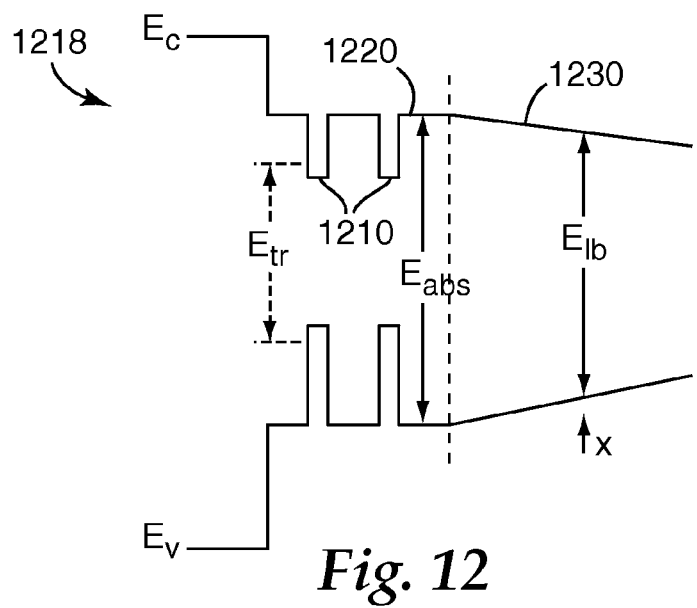
FIG. 12 is a schematic band diagram of another light converter.

In general, auxiliary light absorbing layer 870 and the light absorbing layers, such as light absorbing layers 830-34, in light converter 818 can have any shape band diagram that may be feasible and/or desirable in an application. For example, FIG. 12 is a schematic band diagram of a light converter 1218, similar to light converter 818, that includes potential wells 1210, a light absorbing layer 1220 with a constant band gap energy $E_{abs}$, and an auxiliary light absorbing layer 1230 having a linearly graded band gap. The band gap energy $E_{lb}$ of auxiliary light absorbing layer 1230 at location "X" is smaller than $E_{abs}$ and larger than the transition energy $E_t$ of potential wells 1210.

Figure 13:
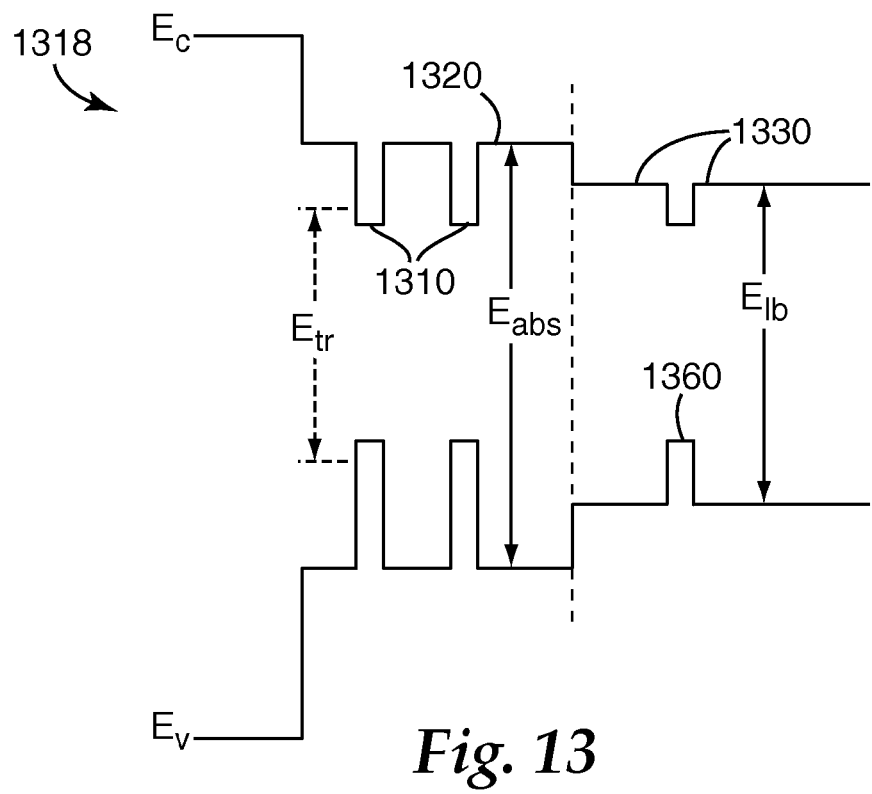
FIG. 13 is a schematic band diagram of another light converter.
Figure 14:
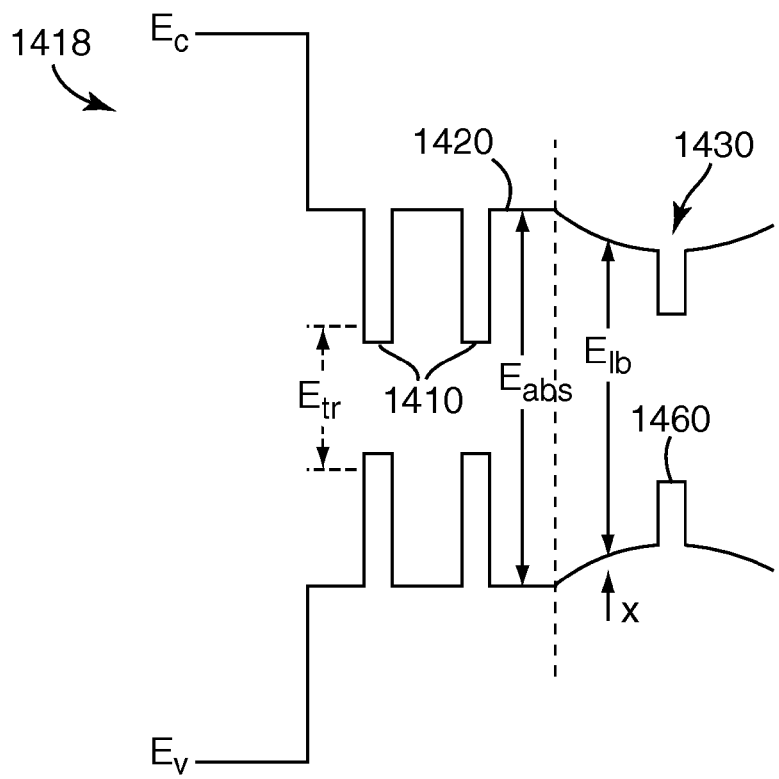
FIG. 14 is a schematic band diagram of another light converter.

As another example, FIG. 13 is a schematic band diagram of a light converter 1318 that includes potential wells 1310, a light absorbing layer 1320 with a constant band gap energy $E_{abs}$, and an auxiliary light absorbing layer 1330 with a constant band gap energy $E_{lb}$ that includes an embedded potential or quantum well 1360. Band gap energy $E_{lb}$ is smaller than $E_{abs}$ and larger than the transition energy $E_{tr}$ of potential wells 1310. As yet another example, FIG. 14 is a schematic band diagram of a light converter 1418 that includes potential wells 1410, a light absorbing layer 1420 with a constant band gap energy $E_{abs}$, and an auxiliary light absorbing layer 1430 with a curved band diagram that includes a potential or quantum well 1460. The auxiliary light absorbing layer has a band gap energy $E_{lb}$ at location "X" that is smaller than $E_{abs}$ and larger than the transition energy $E_{tr}$ of potential wells 1410.

In some cases, light converter layer 818 in FIG. 8, can include one or more carrier blocking layers, such as, or in addition to, window 120, for preventing photo-generated carriers from migrating or diffusing to, for example, an outer surface or an inner region of the light converter. For example, a window 1740 for blocking carriers in, for example, light absorbing layer 1720 and/or auxiliary light absorbing layer 1730 from migrating to, for example, an output surface of light converter 1718 not shown explicitly in the figure. The band gap energy $E_{lb}$ of the auxiliary light absorber at location "X" is smaller than $E_{abs}$ and larger than the transition energy $E_{tr}$ of potential wells 1710.

Example 7

A semiconductor light converting construction similar to light converter 118 in FIG. 1 was fabricated. The relative layer sequence and estimated values of material composition, thickness, bulk band gap energy, and index of refraction for the different layers are summarized in Table II.

TABLE II

Details of various layers in the construction of Example 6:

| Layer No. | Material | Thickness (A°) | Band Gap (eV) | Index of Refraction | Description |
|---|---|---|---|---|---|
| 1 | InP | — | — | — | Substrate |
| 2 | $Ga_{0.47}In_{0.53}As$ | 2000 | 0.77 | — | Buffer |
| 3 | $Cd_{0.38}Mg_{0.21}Zn_{0.41}Se:Cl$ | 5600 | 2.49 | 2.64 | Auxiliary Absorber |
| 4 | Aux. Absorber side: $Cd_{0.38}Mg_{0.21}Zn_{0.41}Se:Cl$ Absorber side: $Cd_{0.35}Mg_{0.26}Zn_{0.39}Se:Cl$ | 500 | 2.49-2.578 | 2.59 | Grading layer |
| 5 | $Cd_{0.35}Mg_{0.26}Zn_{0.39}Se:Cl$ | 4880 | 2.578 | 2.59 | Absorber |
| 6 | $Cd_{0.47}Zn_{0.53}Se$ | 20 | 2.15 | 2.69 | Quantum well |
| 7 | $Cd_{0.35}Mg_{0.26}Zn_{0.39}Se:Cl$ | 1180 | 2.578 | 2.59 | Absorber |
| 8 | $Cd_{0.47}Zn_{0.53}Se$ | 20 | 2.15 | 2.69 | Quantum well |
| 9 | $Cd_{0.35}Mg_{0.26}Zn_{0.39}Se:Cl$ | 1180 | 2.578 | 2.59 | Absorber |
| 10 | $Cd_{0.47}Zn_{0.53}Se$ | 20 | 2.15 | 2.69 | Quantum well |
| 11 | $Cd_{0.35}Mg_{0.26}Zn_{0.39}Se:Cl$ | 1180 | 2.578 | 2.59 | Absorber |
| 12 | $Cd_{0.47}Zn_{0.53}Se$ | 20 | 2.15 | 2.69 | Quantum well |
| 13 | $Cd_{0.35}Mg_{0.26}Zn_{0.39}Se:Cl$ | 80 | 2.578 | 2.59 | Absorber |
| 14 | Absorber side: $Cd_{0.35}Mg_{0.26}Zn_{0.39}Se:Cl$ Window side: $Cd_{0.22}Mg_{0.44}Zn_{0.34}Se$ | 2500 | 2.578-3.0 | 2.59-2.41 | Grading layer |
| 15 | $Cd_{0.19}Mg_{0.49}Zn_{0.32}Se$ | 5000 | 3.0 | 2.41 | Window |

Figure 15:
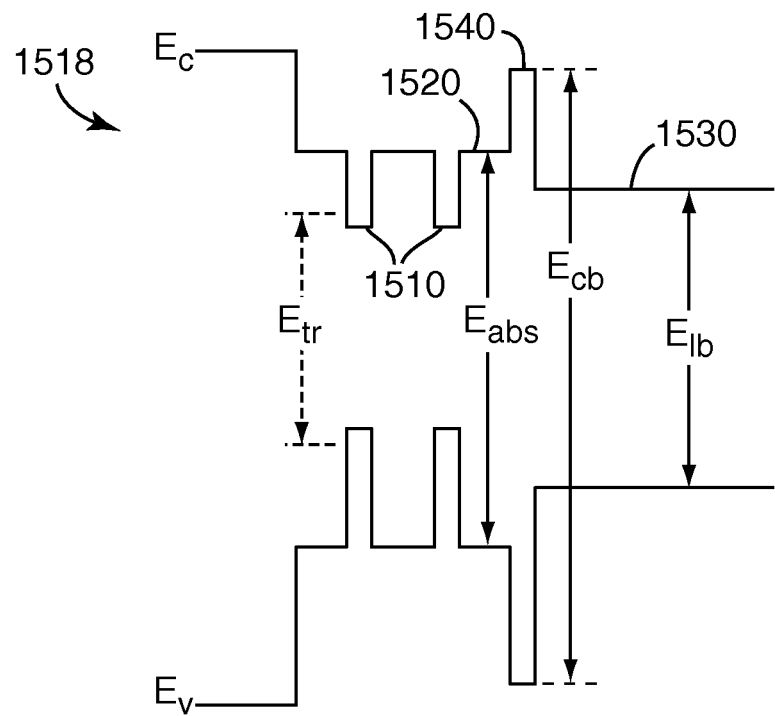
FIG. 15 is a schematic band diagram of another light converter.
Figure 16:
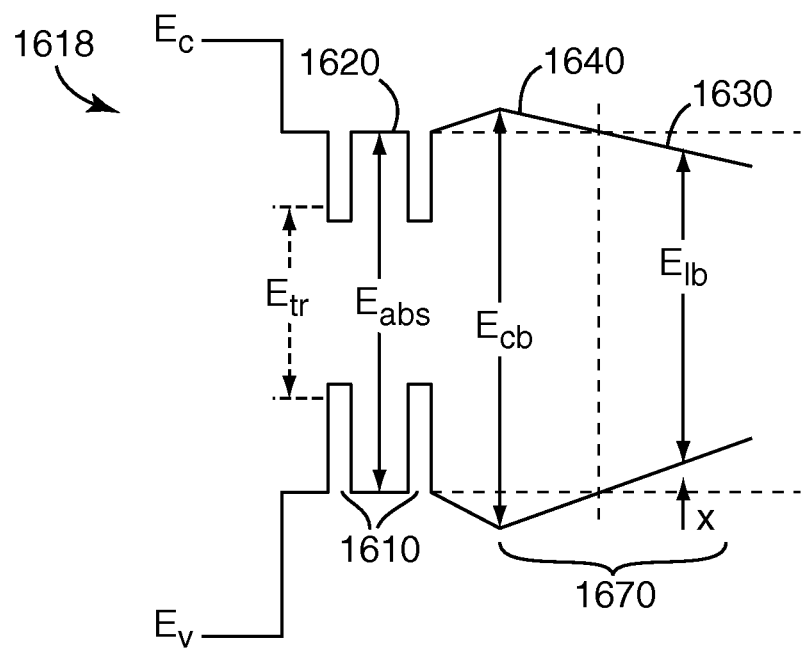
FIG. 16 is a schematic band diagram of another light converter.
Figure 17:
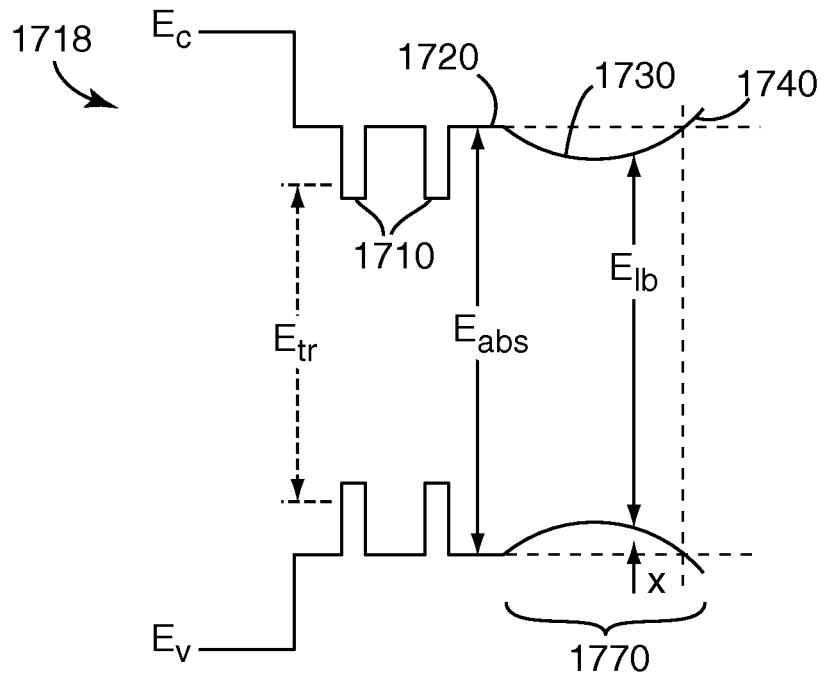
FIG. 17 is a schematic band diagram of another light converter.

FIG. 15 is a schematic band diagram of a light converter 1518 that includes potential wells 1510, a light absorbing layer 1520 with a constant band gap energy $E_{abs}$, an auxiliary light absorbing layer 1530 with a constant band gap energy $E_{lb}$, and a carrier barrier layer 1540, disposed between layers 1520 and 1530, with a constant band gap energy $E_{cb}$ for blocking carriers in light absorbing layer 1520 from migrating, such as diffusing, to auxiliary light absorbing layer 1530. The band gap energy $E_{lb}$ is smaller than $E_{abs}$ and larger than the transition energy $E_{tr}$ of potential wells 1510. As another example, FIG. 16 is a schematic band diagram of a light converter 1618 that includes potential wells 1610, a light absorbing layer 1620 with a constant band gap energy $E_{abs}$, and a linearly graded region 1670 that includes an auxiliary light absorbing layer 1630 and a carrier barrier layer 1640 for blocking carriers in, for example, potential wells 1610 and light absorbing layer 1620 from migrating to auxiliary light absorbing layer 1630. The band gap energy $E_{lb}$ of the auxiliary light absorber at location "X" is smaller than $E_{abs}$ and larger than the transition energy $E_{tr}$ of potential wells 1610. As yet another example, FIG. 17 is a schematic band diagram of a light converter 1718 that includes potential wells 1710, a light absorbing layer 1720 with a constant band gap energy $E_{abs}$, and a non-linearly graded region 1770 that includes an auxiliary light absorbing layer 1730 and a carrier barrier layer or A GaInAs buffer layer was first grown by MBE on an InP substrate to prepare a surface for II-VI growth. The construction was then moved through an ultra-high vacuum transfer system to another MBE chamber for growth of the II-VI epitaxial layers for light conversion. Converter 118 included four CdZnSe quantum wells 140. Each quantum well 140 was sandwiched between CdMgZnSe absorbing layers that could absorb blue light at 440 nm emitted by a GaInN based laser diode.

The InP substrate was removed with a solution of 3HCl:1H$_2$O after the construction was adhesively attached to a glass microscope slide. The etchant stopped at the GaInAs buffer layer (layer #2). The buffer layer was subsequently removed in an agitated solution of 30 ml ammonium hydroxide (30% by weight), 5 ml hydrogen peroxide (30% by weight), 40 g adipic acid, and 200 ml water, leaving only the II-VI light converter 118 attached to the microscope slide.

The resulting construction can be illuminated from the window side with a GaInN blue pump LED with a peak emission at 453 nm and a spectrum similar to spectrum 910 in FIG. 9. The re-emitted output light of the construction can have a peak emission at 538 nm corresponding to a transition energy of 2.305 eV for the quantum wells. As indicated in Table II, the light absorbing layers had a band gap energy of 2.578 eV corresponding to a wavelength $\lambda_{abs}$ of 481 nm in spectrum 910. About 96% of the incident light corresponding to the area under spectrum 910 on the left side of $\lambda_{abs}$ can be absorbed by the absorbing layers, and the remaining 4% corresponding to the area on the right side of $\lambda_{abs}$ can be absorbed by the auxiliary light absorber.

The carrier confinement energy (the total depth of the potential wells) of the construction was 0.273 eV (2.578-2.305). A construction similar to this construction but with the light absorbing layers having the same material as the auxiliary light absorbing layer, would absorb essentially all the pump light but would have a reduced confinement energy of 0.185 eV (2.490-2.305). As a result, the combined use of a light absorbing layer and an auxiliary light absorbing layer, increased the confinement energy from 0.185 eV to 0.273 eV, an increase of nearly 48%, while the auxiliary light absorbing layer absorbed only about 4% of the incident pump light.

Figure 18:
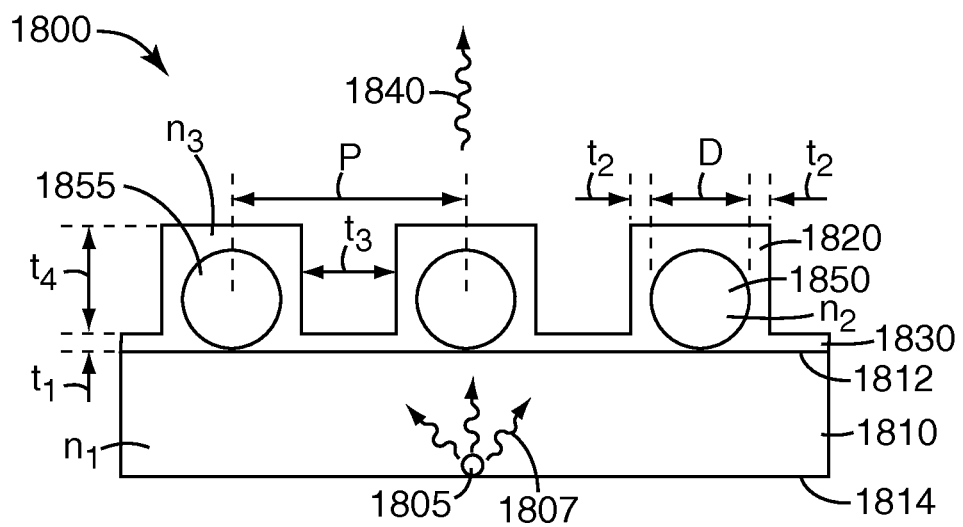
FIG. 18 is a schematic side-view of an optical construction.

Referring back to FIG. 1, the extraction efficiency of structured layer 150 and overcoat 160 as a function of different system parameters was numerically analyzed for optical construction 1800, a side-view of which is shown schematically in FIG. 18. The optical construction included a substrate 1810, a structured layer 1850 that included a square array of spherical particles 1855 arranged directly on top surface 1812 of substrate 1810, and an overcoat 1820 disposed directly on the structured layer and on the exposed regions of the substrate. The index of refraction $n_1$ of the substrate was 2.646. The diameter D of particles 1855 was 200 nm and the index of refraction $n_2$ of the particles was 1.45 corresponding to, for example, $SiO_2$ particles. The spacing P between neighboring particles was 500 nm. The particles covered 50% of top surface 1812 of substrate 1810. For the overcoat, the land thickness $t_1$ was 100 nm, dimensions $t_2$ and $t_3$ were 100 nm each, and $t_4$ was 300 nm. The index $n_3$ of the overcoat was varied during the numerical simulation.

Light source 1805 was placed at bottom surface 1814 of the substrate and emitted uniform light 1807 at 540 nm. The extraction efficiency of optical construction 1800 was modeled and numerically calculated using an effective two dimensional Finite Difference Time Domain (FDTD) approach. The extraction efficiency was defined as the ratio of the power of output light 1840 to the power of emitted incident light 1807. The extraction efficiency in the absence of the structured layer and the overcoat was 16.4%.

Figure 20:
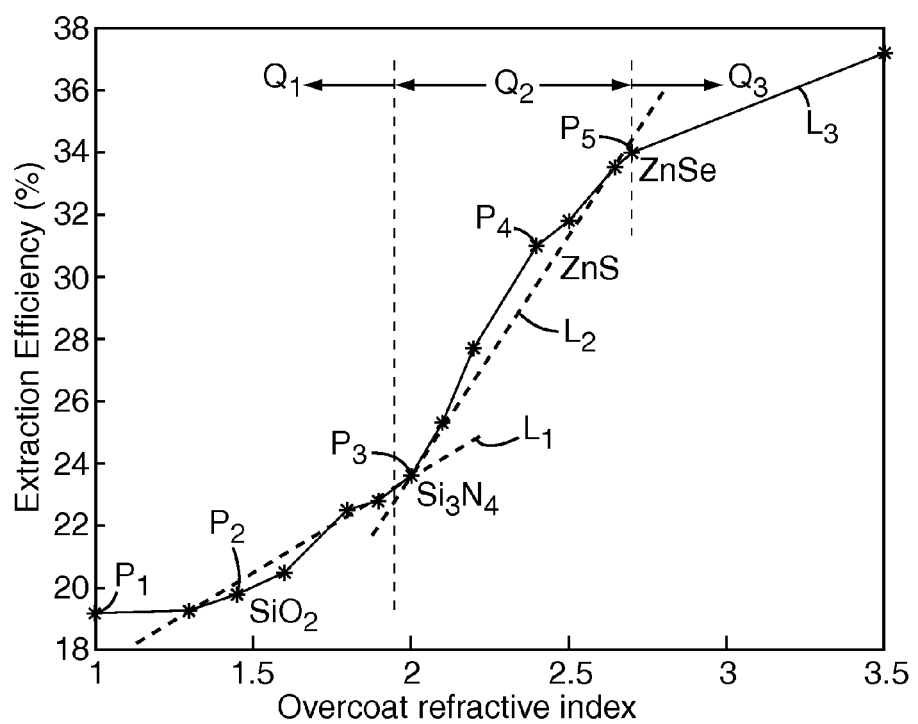
FIG. 20 is a plot of the calculated percent extraction efficiency as a function of the overcoat refractive index.

FIG. 20 shows the extraction efficiency of optical construction 1800 as a function of $n_3$ in the presence of the structured layer and the structured overcoat. The extraction efficiency for an air overcoat ($n_3=1$ corresponding to point $P_1$ in FIG. 20) was 19.2%. Hence, with no (or air) overcoat, the particles increased the extraction efficiency from 16.4% to 19.2%, an increase of about 17.1%. The extraction efficiency at point $P_2$ ($n_3=1.45$), corresponding to an $SiO_2$ overcoat, was 19.8%, an increase of about 20.7% from no overcoat. Points $P_3$-$P_5$ in FIG. 20, correspond to $Si_3N_4$, ZnS, and ZnSe overcoats, respectively. The extraction efficiency generally follows line $L_1$ in region $Q_1$, line $L_2$ in region $Q_2$, and line $L_3$ in region $Q_3$. Line $L_2$ in Region $Q_2$ corresponds to the overcoat index $n_3$ being in a range from about 2.0 to about 2.7 and has a greater slope than lines $L_1$ and $L_3$. Region Q2 indicates a greater dependence of the extraction efficiency on the index of refraction of the structured overcoat.

Figure 21A:
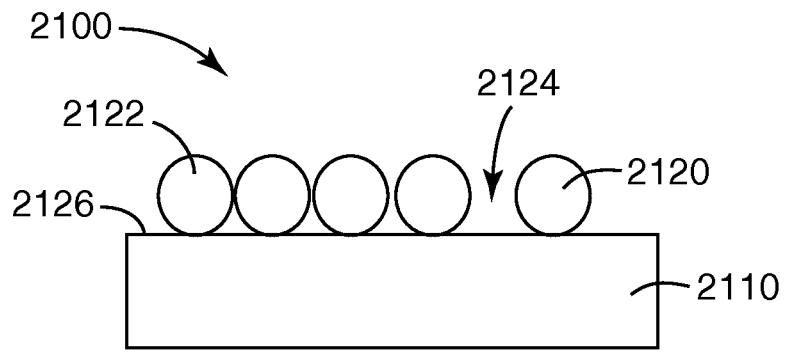
FIGS. 21A-21C are schematic representations of devices at intermediate stages or steps in a process for fabricating an optical construction.

In some cases, structured layer 150 can be modified before applying overcoat 170. For example, in some cases, the shape and/or the size of at least some of the structures in structured layer 150 can be modified before the structured layer is coated with overcoat 170. One such exemplary process is described in reference to FIGS. 21A-21C. FIG. 21A is a schematic side-view of an optical construction 2100 that includes a semiconductor substrate 2110 and a structured layer 2120 disposed directly on the semiconductor substrate. The substrate can, for example, be similar to second window 121 in FIG. 1 or auxiliary absorbing layer 870 in FIG. 8. In some cases, substrate 2120 can be a multilayer, a layer of which can, for example, be similar to auxiliary absorbing layer 870.

Structured layer 2120 can be similar to, for example, structured layer 150 in FIG. 1. Structured layer 2120 includes a plurality of discrete particles 2122 disposed directly on substrate 2110. In some cases, particles 2122 can be organic, such as polymeric. Exemplary polymers include polystyrene, polycarbonate, poly(meth)acrylate (e.g., polymethyl methacrylate (PMMA), polyolefins (e.g., polypropylene (PP)), polyurethane, polyesters (e.g., polyethylene terephthalate (PET)), polyamides, polyimides, phenolic resins, cellulose diacetate, cellulose triacetate, styrene-acrylonitrile copolymers, epoxies, and the like.

Particles 2122 form a monolayer on top surface 2126 of substrate 2110. The monolayer includes open areas, such as open area 2124, exposing the top surface of the substrate. In some cases, the particles can be shrunk or reduced in size by exposing the particles to an etchant. For example, the etchant can etch away portions of each particle resulting in a smaller or a shrunk particle. Exemplary etching methods include wet or dry chemical etching, and reactive ion etching. In some cases, the particles are polystyrene and the etching method is an oxygen plasma or a reactive ion etch.

In some cases, particles 2122 are made to reflow by exposing the particles to sufficient heat. For example, polymeric particles 2122 can reflow at a temperature that is at or near the melting point of the particles. In some cases, an etchant and heat can be simultaneously applied to the particles to shrink and reflow at least some of the particles. In some cases, the etching process can generate heat which with some or no additional heat can reflow the particles.

In some cases, the average size of structures 2122 can substantially determine the surface density of the structures and the amount of etching, such as the etching time, can determine percent area coverage by the structures (structures 2132) after the etching step. In some cases, the required initial average structure size and the amount of etching can be calculated, or otherwise determined, based on a desired surface structure density and percent surface coverage. For example, for a given desired particle density, an average particle diameter R can be determined, and for a given desired percent area coverage and based on, for example, experimental data, the etch parameters, such as for example the etch time, can be determined. Next, a monolayer of, for example, close packed, particles with an average diameter R can be applied to the surface to provide the desired surface particle density. Next, the particles can be etched according to the determined etch parameters to result in a desired percent surface coverage by the etched particles. In some cases, the particles can be over coated.

In some cases, to achieve a desired final percent surface coverage, first a plurality of structures is disposed on top surface 2126 that result in an initial percent area coverage that is greater than the desired final percent area coverage. Next, the at least some of the structures are sufficiently shrunk to reduce the initial percent area coverage to the desired final percent area coverage. In some cases, at least some of the structures can be reflowed. In some cases, the structures are next coated with an overcoat to cover the shrunk structures and the top surface in the uncovered areas.

Figure 21B:
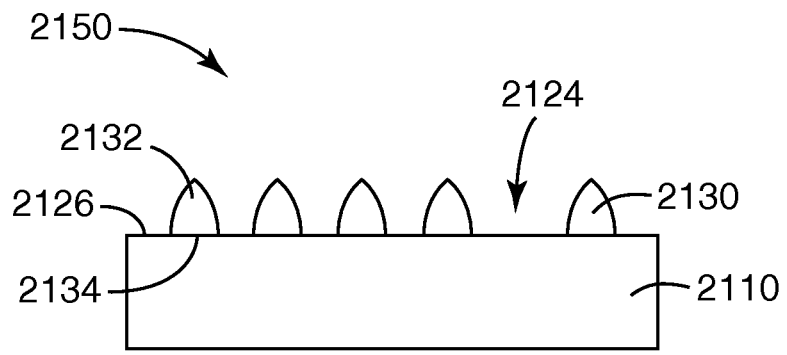

After being subjected to sufficient heat and one or more etchants, optical construction 2100 is modified to optical construction 2150 shown schematically in FIG. 21B. In particular, structured layer 2120 is changed or modified to structured layer 2130 after particles 2122 in layer 2120 have been partially etched and reflowed. Structured layer 2130 includes particles 2132 that are smaller than corresponding particles 2122 and have reflowed due to exposure to heat. After the reflow, particles 2132 have flat bottoms 2134. In some cases, particles 2132 are dome- or cone-like. In some cases, the steps of reflowing and shrinking the particles can be carried out at the same time or simultaneously. In some cases, the two steps can be carried out sequentially. For example, the particles can be reduced in size by an etchant, followed by a heating step to reflow the etched particles.

In some cases, the percent coverage of top surface 2126 of substrate 2110 by the plurality of the particles decreases after applying the etchant and the heat to the particles. For example, in such cases, particles 2122 cover a first percent of top surface 2126 in FIG. 21A and particles 2132 cover a second percent of top surface 2126 in FIG. 21B, where the second percent is less than the first percent.

In some cases, the shrinking step can reduce the average size, such as the average lateral size, of a particle by at least 10%, or by at least 20%, or by at least 30%, or by at least 40%, or by at least 50%, or by at least 60%, or by at least 70%. In some cases, the percent area coverage of the top surface of the substrate by the plurality of the structures decreases after the shrinking step. For example, in such cases, the percent area coverage can decrease by at least 10%, or by at least 20%, or by at least 30%, or by at least 40%, or by at least 50%.

Figure 21C:
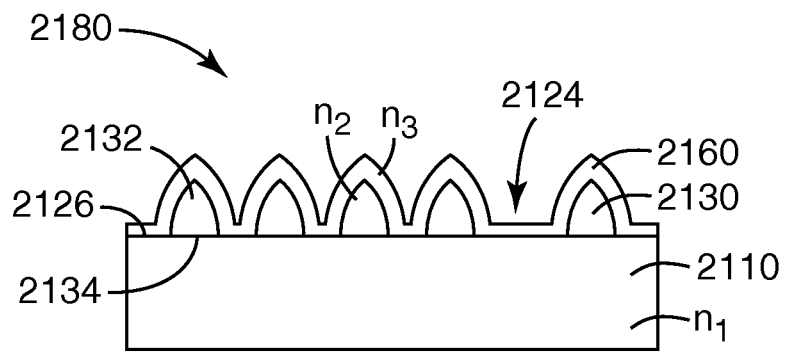

In some cases, optical construction 2150 is coated with an overcoat 2160 resulting in optical construction 2180 shown schematically in FIG. 21C. Overcoat 2160 covers the plurality of particles 2132 and the top surface of substrate 2110 in the open areas, such as in open area 2124.

Substrate 2110 has a refractive index $n_1$, for example, in the visible region of the spectrum, particles 2132 in structured layer 2130 have a refractive index $n_2$, and overcoat 2160 has a refractive index $n_3$. In some cases, $n_2$ is less than $n_1$. For example, in such cases, substrate 2110 includes a semiconductor material having an index in a range from about 2 to about 2.7, or from about 2 to about 2.5, and particles 2132 include a polymer having an index in a range from about 1.5 to about 1.8. In some cases, $n_3$ is larger than $n_1$. For example, in such cases, substrate 2110 includes a semiconductor material having an index in a range from about 2 to about 2.3 and overcoat 2160 includes a different semiconductor having an index in a range from about 2.3 to about 2.7.

Example 8

Figure 22A:
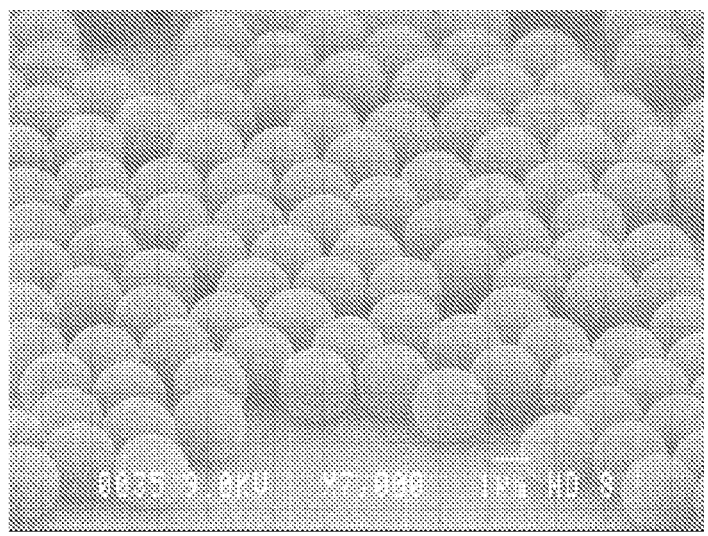
FIG. 22A is an SEM image of a single layer of polystyrene particles.
Figure 22B:
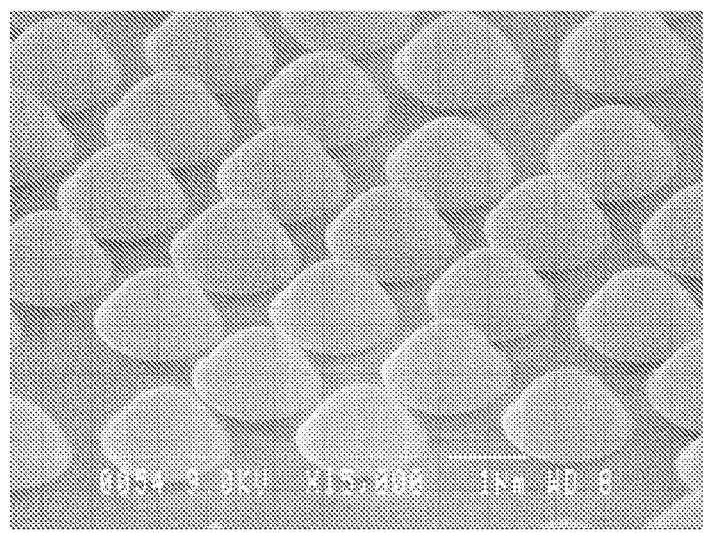
FIG. 22B is an SEM image of the particles in FIG. 22A etched and reflowed.
Figure 22C:
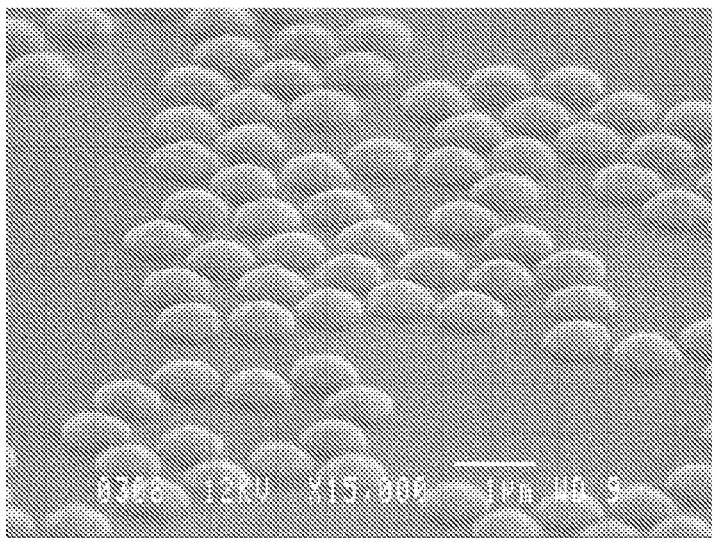
FIG. 22C is an SEM image of the particles in FIG. 22B over coated with ZnS.

A semiconductor light converting construction was fabricated using the process outlined in Example 1. The calculated EQE of the construction was 15.29%. The absorber side of the construction was coated with polystyrene (PS) microspheres resulting in a structured layer similar to structured layer 2120 in FIG. 21A. The microspheres had an average diameter of about 1000 nm and were obtained from VWR Scientific Products (South Plainfield, N.J.). The index of refraction of the microspheres was about 1.59 and the index of refraction of the absorber in the construction was about 2.6. The microspheres were dispersed in $H_2O$ to a 10% solid content by weight. The solution was applied to the top surface of the absorber (top surface 2126 in FIG. 21A) using a spin-on coating method at a speed of about 200 rpm for about 20 seconds followed by a speed of about 5000 rpm for about 5 seconds. FIG. 22A is an SEM image of the resulting sample showing close packed microspherical PS particles on the top surface of the light converting construction. The area coverage of the top surface by the microspheres was about 90% and the calculated EQE of the resulting sample was 22.9%. Hence, the PS particles increased the EQE from 15.29% to 22.9%, an increase of about 49.8%. The sample was then etched in an oxygen plasma (6 mT, RF power of 80 W, and inductive coupling plasma power of 1200 W) to reflow and reduce the size of the particles. The resulting surface coverage by the particles was about 64%. Hence, the etch step reduced the percent area coverage from about 90% to about 64%. FIG. 22B is an SEM image of the resulting sample. Particles were cone-like or dome-like with flat bottoms. The calculated EQE of the resulting sample was 27.8%. Next, the sample was overcoated with ZnS using a vacuum evaporation process. The thickness of the overcoat was about 400 nm and the refractive index of the ZnS overcoat was about 2.4. FIG. 22C is an SEM image of the resulting sample. The calculated EQE of the resulting sample was 37.8%. Hence, the addition of the ZnS overcoat increased the EQE from 27.8% to 37.8%, an increase of about 36%.

Example 9

A semiconductor light converting construction was fabricated using the process outlined in Example 1. The calculated EQE of the construction was 17.65%. The absorber side of the construction was coated with polystyrene (PS) microspheres resulting in a structured layer similar to structured layer 2120 in FIG. 21A. The microspheres had an average diameter of about 500 nm and were obtained from VWR Scientific Products (South Plainfield, N.J.). The index of refraction of the microspheres was about 1.59 and the index of refraction of the absorber in the construction was about 2.6. The microspheres were dispersed in $H_2O$ to a 1.5% solid content by weight. The solution was applied to the top surface of the absorber (top surface 2126 in FIG. 21A) using a dip coating method at a speed of about 65 mm/min. The sample was dip coated a single time. The calculated EQE of the resulting sample was 26.40%. Hence, the PS particles increased the EQE from 17.65% to 26.40%, an increase of about 49.6%. The sample was then etched in an oxygen plasma (200 mT, 200 mW, and 8 inch diameter platen) to slightly shrink and reflow the particles. The resulting particles were cone-like or dome-like with flat bottoms. Next, the sample was overcoated with ZnS using a vacuum evaporation process. The thickness of the overcoat was about 400 nm and the refractive index of the ZnS overcoat was about 2.4. The calculated EQE of the resulting sample was 35.5%. Hence, the addition of the ZnS overcoat increased the EQE from 26.4% to 35.5%, an increase of about 34.5%.

Figure 23:
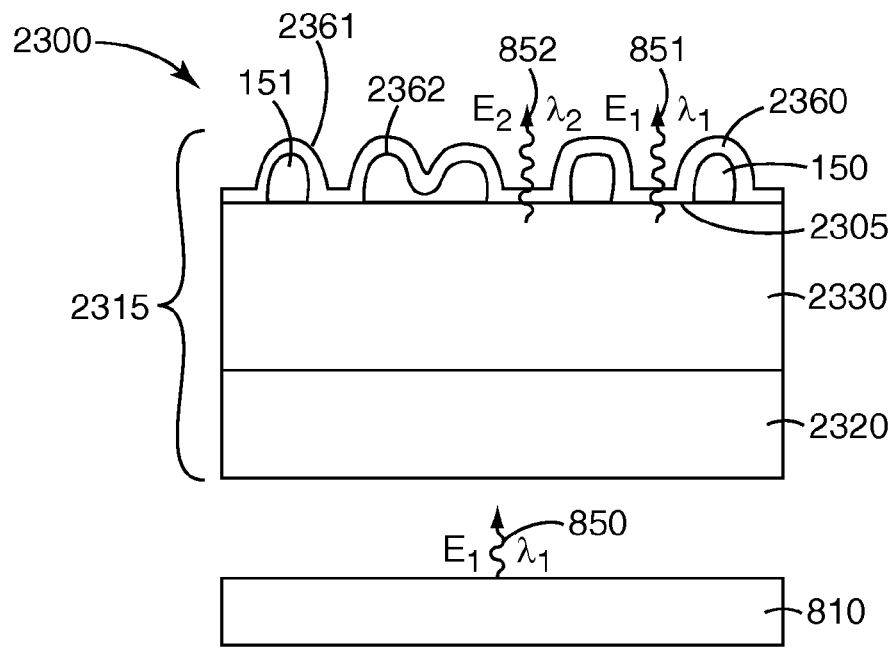
FIG. 23 is a schematic side-view of a light source.

FIG. 23 is a schematic side-view of a light source 2300 that includes LED light source emitting light 850 at the first wavelength $\lambda_1$ and light converting layer 2315 converting at least a portion of light 850 to light 852 at the longer second wavelength $\lambda_2$. Light converting construction 2315 includes a phosphor slab 2330 having a first index of refraction $n_1$ disposed on a substrate 2320. Phosphor slab 2330 absorbs at least a portion of light 850 and re-emits at least a portion of the absorbed light as light 852 at the wavelength $\lambda_2$. Exemplary phosphors that may be used in phosphor slab 2330 include strontium thiogallates, doped GaN, copper-activated zinc sulfide, and silver-activated zinc sulfide. Other useful phosphors include doped YAG, silicate, silicon oxynitride, silicon nitride, and aluminate based phosphors. Examples of such phosphors include Ce:YAG, SrSiON:Eu, SrBaSiO:Eu, SrSiN:Eu, and BaSrSiN:Eu.

Substrate 2320 can be include any material that may be suitable in an application. Exemplary materials include glass, polymers, ceramics such as alumina, sapphire, and metal, such as metals that include one or more transparent openings or apertures for allowing light to pass through. In some cases, substrate 2320 is substantially optically transmissive at the first wavelength. In some cases, the substrate may be opaque at $\lambda_1$. In such cases, the substrate can include one or more optical, or otherwise, openings for light 850 to pass through the substrate. In some cases, substrate 2320 can include other functional layers, not explicitly shown in FIG. 23, such as a reflector at $\lambda_2$ or a heat sink.

Light converting construction 2315 further includes structured layer 150 disposed on phosphor slab 2330. Structured layer 150 has a second index of refraction $n_2$ that is smaller than the first index of refraction $n_1$ of the phosphor slab. The structured layer includes a plurality of structures 151 disposed directly on the phosphor slab and a plurality of openings 2305 exposing the phosphor slab. Light converting construction 2315 further includes a structured overcoat 2360, similar to overcoat 160, disposed directly on at least a portion of structured layer 150 and a portion of the phosphor slab in the plurality of openings, such as opening 2305. Structured overcoat 2360 has a third index of refraction $n_3$ that is greater than the second index of refraction $n_2$.

In some cases, structured overcoat 2360 can enhance the extraction of a light at the second wavelength $\lambda_2$ that is trapped in the phosphor slab by extending the evanescent tail of the trapped light farther into the structured overcoat. The tail extension can increase the scattering of the trapped light by structures 151 resulting in increased extraction of the trapped light from the phosphor slab.

In some cases, structured layer 150 is substantially optically transparent at the second wavelength. In some cases, structured overcoat 2360 is substantially optically transparent at the second wavelength. In some cases, the plurality of structures in structured layer 150 include a plurality of discrete structures, such as discrete particles, where in some cases, a substantial fraction of the plurality of discrete particles are substantially spherical. In some cases, the plurality of structures in structured layer 150 include a plurality of interconnected structures.

In some cases, structured overcoat 2360 includes at least one of $Si_3N_4$, ZnS, ZnSe, ZnSSe, ITO, $TiO_2$, $ZrO_2$, $Ta_2O_5$, $HfO_2$, and silicate, such as a silicate glass. In some cases, structured overcoat 2360 includes a semiconductor. In some cases, structured outer surface 2361 of structured overcoat 2360 conforms to structured outer surface 2362 of structured layer 150.

The extraction efficiency of light converting construction 2315 as a function of different system parameters was numerically analyzed using optical construction 1800 in FIG. 18. The index of refraction $n_1$ of the substrate was 1.84, a typical value for a phosphor slab, such as phosphor slab 2330. The diameter D of particles 1855 was 200 nm and the index of refraction $n_2$ of the particles was 1.45 corresponding to, for example, $SiO_2$ particles. The spacing P between neighboring particles was 500 nm. The particles covered 50% of top surface 1812 of substrate 1810. For the overcoat, the land thickness $t_1$ was 100 nm, dimensions $t_2$ and $t_3$ were 100 nm each, and $t_4$ was 300 nm. The index $n_3$ of the overcoat was varied during the numerical simulation.

Light source 1805 was placed at bottom surface 1814 of the substrate and emitted uniform light 1807 at 540 nm. The extraction efficiency of optical construction 1800 was modeled and numerically calculated using an effective two dimensional Finite Difference Time Domain (FDTD) approach.

Figure 24:
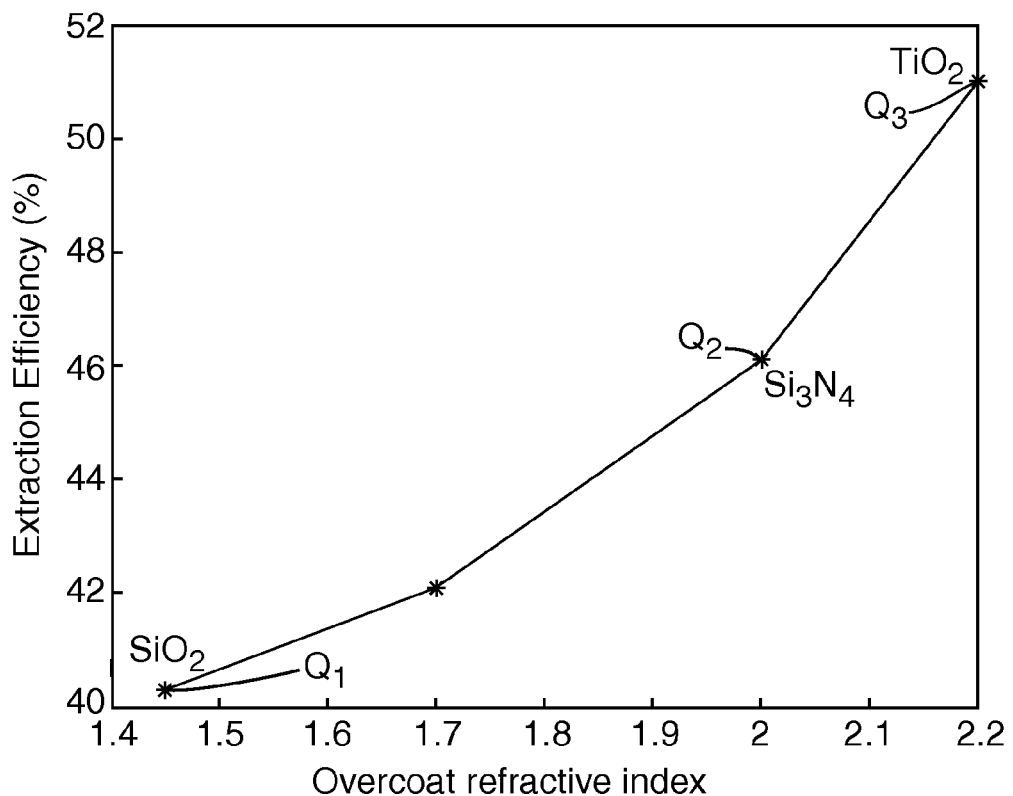
FIG. 24 is a plot of the calculated percent extraction efficiency as a function of the overcoat refractive index.

FIG. 24 shows the extraction efficiency of optical construction 1800 as a function of $n_3$ in the presence of the structured layer and the overcoat. The extraction efficiency at point $Q_1$ ($n_3$=1.45), corresponding to an $SiO_2$ overcoat, was 40.5%. Points $Q_2$ and $Q_3$ in FIG. 24 correspond to $Si_3N_4$, and $TiO_2$ overcoats, respectively. For $n_3$ in a range from about 1.35 to about 2.2, or from about 1.45 to about 2.2, the extraction efficiency is at least about 40%. In some cases, the overcoat can comprise $MgF_2$ having an index of refraction in a range from about 1.38 to about 1.39. In some cases, the overcoat can comprise a porous coating. For example, the overcoat can comprise a porous $SiO_2$ coating having an index of refraction less than about 1.45, such as an index of about 1.4, or about 1.35, or about 1.30, or about 1.29.

As used herein, terms such as "vertical", "horizontal", "above", "below", "left", "right", "upper" and "lower", "top" and "bottom" and other similar terms, refer to relative positions as shown in the figures. In general, a physical embodiment can have a different orientation, and in that case, the terms are intended to refer to relative positions modified to the actual orientation of the device. For example, even if the construction in FIG. 1 is flipped as compared to the orientation in the figure, first absorbing layer 130 is still considered to be "below" potential well 140.

While specific examples of the invention are described in detail above to facilitate explanation of various aspects of the invention, it should be understood that the intention is not to limit the invention to the specifics of the examples. Rather, the intention is to cover all modifications, embodiments, and alternatives falling within the spirit and scope of the invention as defined by the appended claims.

What is claimed is:

1. An optical construction, comprising:
   a first semiconductor layer having an index of refraction $n_1$ at a first wavelength in the visible;
   a second semiconductor layer disposed on the first semiconductor layer and having an index of refraction $n_2$ at the first wavelength, $n_2$ being smaller than $n_1$;
   a third semiconductor layer disposed on the second semiconductor layer such that the second semiconductor layer is disposed between the first and third semiconductor layers, and the third semiconductor layer having an index of refraction $n_3$ at the first wavelength, $n_3$ being greater than $n_2$;
   a structured layer disposed on the third semiconductor layer; and
   an overcoat disposed directly on at least a portion of the structured layer to enhance extraction of light from the third semiconductor layer,
   wherein the optical construction is substantially transmissive at the first wavelength.

2. The optical construction of claim 1, wherein the overcoat comprises a photonic crystal.

3. The optical construction of claim 1, wherein an index of refraction of the overcoat at the first wavelength is in a range from about 2.0 to about 2.7.

4. The optical construction of claim 1 being capable of down converting light at a second wavelength to light at the first wavelength, the first wavelength being longer than the second wavelength.

5. The optical construction of claim 4, wherein when illuminated with an incident light having a spectrum centered at the second wavelength and comprising a wavelength $\lambda_e$ longer than the second wavelength, the second semiconductor layer absorbs light at the second wavelength, but not light at $\lambda_e$, and the third semiconductor layer absorbs light at $\lambda_e$.

6. The optical construction of claim 4, wherein the second semiconductor layer is substantially light absorbing at the second, but not the first, wavelength.

7. The optical construction of claim 4, wherein the third semiconductor layer is substantially light absorbing at the second, but not the first, wavelength.

8. The optical construction of claim 1, wherein the first semiconductor layer is a potential well.

9. A light emitting system, comprising:
- a light source emitting light having a spectrum centered at a first wavelength and comprising a tail end at a wavelength $\lambda_e$ longer than the first wavelength;
- one or more first semiconductor light absorbing layers capable of absorbing light at the first wavelength, but not the wavelength $\lambda_e$, the first semiconductor light absorbing layers being configured to absorb at least 80% of light emitted by the light source;
- a semiconductor potential well converting at least a portion of light absorbed by the one or more first semiconductor light absorbing layers at the first wavelength to a longer second wavelength output light; and
- one or more second semiconductor light absorbing layers capable of absorbing light at the wavelength $\lambda_e$, the second semiconductor light absorbing layers being configured to absorb the remaining light emitted by the light source.

10. The light emitting system of claim 9, wherein the one or more first semiconductor light absorbing layers absorbs at least 90% of light emitted by the light source.

11. A semiconductor light converting construction, comprising:
- a first semiconductor layer having a band gap energy $E_{abs}$ for absorbing a portion, but not all, of an incident light;
- a semiconductor potential well having a transition energy $E_{tr}$ less than $E_{abs}$, the semiconductor potential well being disposed adjacent to the first semiconductor layer and configured to down convert the portion of the incident light absorbed by the first semiconductor layer; and
- a second semiconductor layer having a band gap energy $E_{1b}$ less than $E_{abs}$ and greater than $E_{tr}$ and being positioned to absorb the remaining incident light after the portion of the incident light is absorbed by the first semiconductor layer.

12. The semiconductor light converting construction of claim 11, wherein the portion of the incident light absorbed by the first semiconductor layer and the remaining incident light absorbed by the second semiconductor layer include different wavelength regions of the spectrum.

13. The semiconductor light converting construction of claim 11 further having a semiconductor window having a band gap energy $E_w$ greater than $E_{abs}$; wherein $E_w$ is greater than a photon energy of the incident light.

14. The semiconductor light converting construction of claim 11, wherein the first semiconductor layer is disposed between the semiconductor potential well and the second semiconductor layer.

15. The semiconductor light converting construction of claim 11, each of the first and second semiconductor layers is immediately adjacent the semiconductor potential well.

* * * * *

UNITED STATES PATENT AND TRADEMARK OFFICE
CERTIFICATE OF CORRECTION

| | | |
|---|---|---|
| PATENT NO. | : 9,053,959 B2 | Page 1 of 1 |
| APPLICATION NO. | : 13/000598 | |
| DATED | : June 9, 2015 | |
| INVENTOR(S) | : Haase et al. | |

It is certified that error appears in the above-identified patent and that said Letters Patent is hereby corrected as shown below:

In the specification

Column 7
Line 17, Delete "$Ta_2O_3$," and insert -- $La_2O_3$, --, therefor.

Column 8
Line 9, Delete "that that" and insert -- $E_{pw}$ that --, therefor.

Column 15
Line 48, Delete "energy" and insert -- energy $E_{pw}$ --, therefor.

Column 16
Line 61, Delete "$E_t$," and insert -- $E_{tr}$ --, therefor.

In the claims

Column 26
Line 4, Claim 11, delete "$E_t$," and insert -- $E_{tr}$ --, therefor.
Line 9, Claim 11, delete "$E_{1b}$" and insert -- $E_{lb}$ --, therefor.

Signed and Sealed this
Ninth Day of February, 2016

Michelle K. Lee
*Director of the United States Patent and Trademark Office*